(12) United States Patent
Cheng et al.

(10) Patent No.: US 12,362,316 B2
(45) Date of Patent: Jul. 15, 2025

(54) ELECTRONIC STRUCTURE HAVING A PROTRUSION STRUCTURE DISPOSED IN A GAP BETWEEN A CIRCUIT PATTERN STRUCTURE AND A PACKAGING STRUCTURE

(71) Applicant: Advanced Semiconductor Engineering, Inc., Kaohsiung (TW)

(72) Inventors: Po-Jen Cheng, Kaohsiung (TW); Wei-Jen Wang, Kaohsiung (TW); Fu-Yuan Chen, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 417 days.

(21) Appl. No.: 17/670,320

(22) Filed: Feb. 11, 2022

(65) Prior Publication Data
US 2023/0260957 A1   Aug. 17, 2023

(51) Int. Cl.
*H01L 23/00* (2006.01)
*H01L 23/498* (2006.01)

(52) U.S. Cl.
CPC ........ *H01L 24/81* (2013.01); *H01L 23/49822* (2013.01); *H01L 24/29* (2013.01); *H01L 2224/29006* (2013.01); *H01L 2224/81379* (2013.01)

(58) Field of Classification Search
CPC ..... H01L 23/5389; H01L 24/29; H01L 24/81; H01L 21/563; H01L 2224/29006; H01L 2224/81379; H01L 2221/68327; H01L 2221/68345; H01L 2225/1011; H01L 2225/1017; H01L 2225/1023; H01L 2225/1058; H01L 2225/1064; H01L 2225/1076; H01L 25/50; H01L 25/105; H01L 23/49822; H01L 23/49816
See application file for complete search history.

(56) References Cited

U.S. PATENT DOCUMENTS

| | | | |
|---|---|---|---|
| 6,815,817 B2* | 11/2004 | Akram | H01L 21/563 257/737 |
| 10,494,549 B2* | 12/2019 | Kim | H01L 24/27 |
| 10,748,868 B2* | 8/2020 | Fathi | B32B 7/14 |
| 2006/0267171 A1* | 11/2006 | Lee | H01L 24/28 257/E21.503 |
| 2007/0096337 A1* | 5/2007 | Choi | H01L 24/28 257/E21.511 |
| 2012/0118480 A1* | 5/2012 | Paik | C09J 11/08 252/514 |
| 2015/0061095 A1* | 3/2015 | Choi | H01L 23/5385 257/777 |
| 2019/0326264 A1* | 10/2019 | Shen | H01L 24/19 |
| 2022/0051996 A1* | 2/2022 | Lee | H01L 24/19 |

* cited by examiner

*Primary Examiner* — Khiem D Nguyen
(74) *Attorney, Agent, or Firm* — FOLEY & LARDNER LLP

(57) ABSTRACT

An electronic structure includes a packaging structure, a circuit pattern structure, an underfill and a protrusion structure. The circuit pattern structure is disposed over the packaging structure. A gap is between the circuit pattern structure and the packaging structure. The underfill is disposed in the gap. The protrusion structure is disposed in the gap, and is configured to facilitate the distributing of the underfill in the gap.

8 Claims, 32 Drawing Sheets ns ELECTRONIC STRUCTURE HAVING A
PROTRUSION STRUCTURE DISPOSED IN A
GAP BETWEEN A CIRCUIT PATTERN
STRUCTURE AND A PACKAGING
STRUCTURE

BACKGROUND

1. Field of the Disclosure

The present disclosure relates to an electronic structure, and to an electronic structure including a packaging structure and a circuit pattern structure disposed over the packaging structure.

2. Description of the Related Art

As for a stacked product such as a wiring structure electrically connected to a package structure, small size solders may be used to electrically connect the wiring structure and the package structure, thereby preventing the solders from bridging. However, it is difficult for the underfill to flow to a center of a space between the wiring structure and the package structure through capillary effect since the space is defined be two plain surfaces. Thus, a void may be generated adjacent to the center, which may adversely affect the reliability and performance of the stacked product. In addition, the warpage may cause the space to be smaller, resulting in more difficult for the underfill to flow through the center of the space.

SUMMARY

In some embodiments, an electronic structure includes a packaging structure, a circuit pattern structure, an underfill and a protrusion structure. The circuit pattern structure is disposed over the packaging structure. A gap is between the circuit pattern structure and the packaging structure. The underfill is disposed in the gap. The protrusion structure is disposed in the gap, and is configured to facilitate the distributing of the underfill in the gap.

In some embodiments, an electronic structure includes a packaging structure, a circuit pattern structure and a capillary structure. The circuit pattern structure is disposed over the packaging structure. A gap is between the circuit pattern structure and the packaging structure. The gap includes a first portion and a second portion outside the first portion. The first portion accommodates an electrical connection between the circuit pattern structure and the packaging structure. The capillary structure is disposed in the second portion of the gap, and is configured to facilitate an underfill to flow through the second portion of the gap.

In some embodiments, an electronic structure includes a packaging structure, a circuit pattern structure, an underfill and a support structure. The circuit pattern structure is disposed over the packaging structure. A gap is between the circuit pattern structure and the packaging structure. The gap includes a first portion and a second portion. The first portion is closer to a lateral surface of the circuit pattern structure than the second portion is. A height of the first portion is greater than a height of the second portion. The underfill is disposed in the gap and includes a filler. The support structure is disposed in the second portion of the gap, and is configured to maintain the height of the second portion greater than a diameter of the filler of the underfill.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
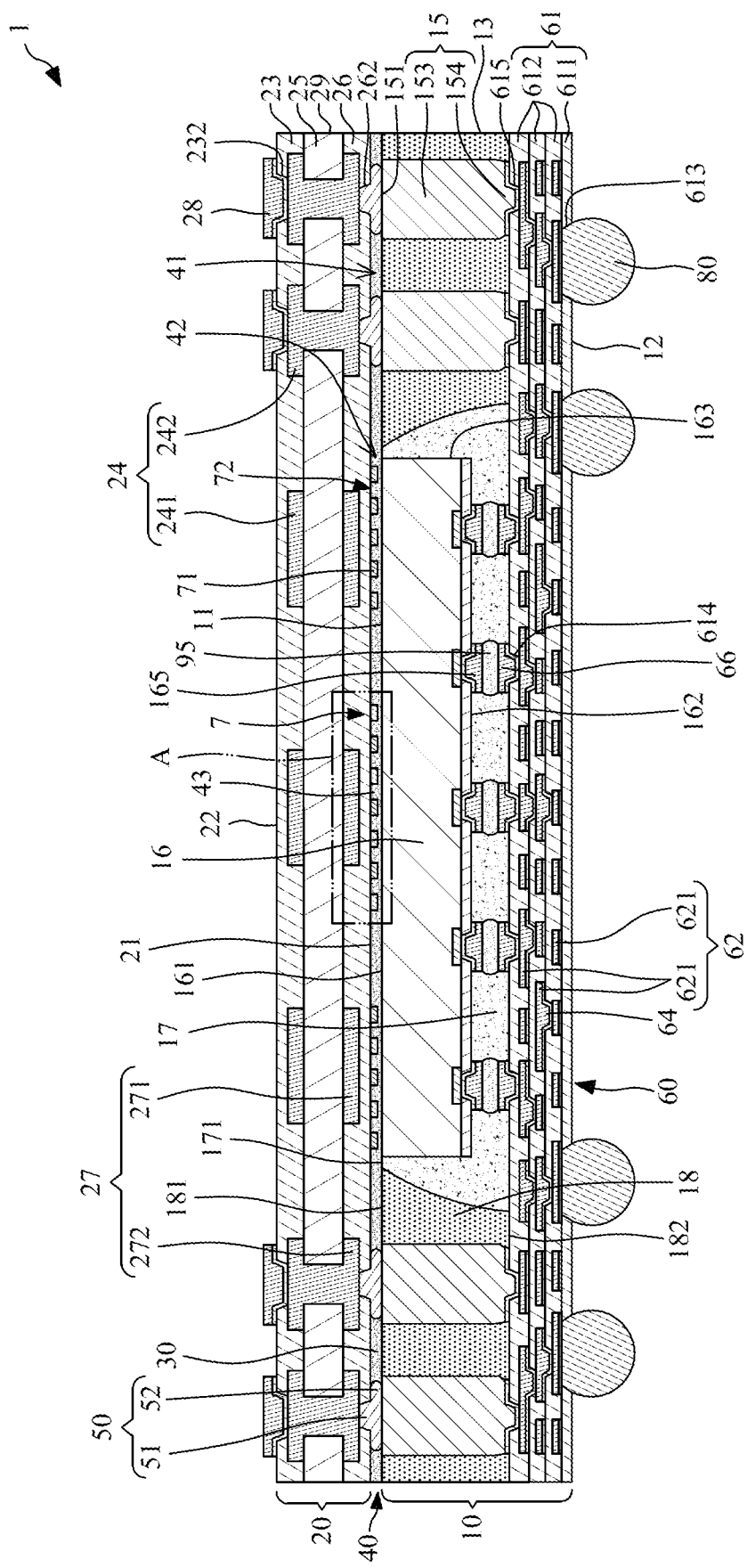
FIG. 1 illustrates a cross-sectional view of an electronic structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of an electronic structure 1 according to some embodiments of the present disclosure. The electronic structure 1 includes a packaging structure 10, a circuit pattern structure 20, a plurality of conductive connectors 50, an underfill 30, a protrusion structure 7 and a plurality of electrical connectors 80. In some embodiments, the electronic structure 1 may be an electronic package structure.

The packaging structure 10 may be, for example, a conductive structure, an electronic structure, a substrate structure, a wiring structure or a circuit pattern structure. In some embodiments, the packaging structure 10 may include a redistribution structure 60, at least one conductive pillar 15, at least one electronic component 16, an underfill 17 and an encapsulant 18. The packaging structure 10 may have a top surface 11, a bottom surface 12 opposite to the top surface 11 and a lateral surface 13 extending between the top surface 11 and the bottom surface 12. The top surface 11 of the packaging structure 10 faces the circuit pattern structure 20.

The redistribution structure 60 may include a dielectric structure 61, at least one redistribution layer 62, a plurality of inner vias 64 and a plurality of bonding pads 66. The dielectric structure 61 may include a plurality of dielectric layers (including, for example, one first dielectric layer 611 and three second dielectric layers 612). The second dielectric layers 612 may be disposed on a top surface of the first dielectric layer 611 and stacked on one another. The first dielectric layer 611 and the second dielectric layers 612 may be made of a cured photoimageable dielectric (PID) material such as epoxy or polyimide (PI) including photoinitiators. The redistribution layer 62 may be embedded in the dielectric structure 61 and may include a plurality of circuit layers 621 (e.g., patterned circuit layers). The inner vias 64 may electrically connect at least one circuit layer 621 or two adjacent circuit layers 621 of the redistribution layer 62. In some embodiments, the inner vias 64 may taper downward. That is, a width of each of the inner vias 64 may gradually decrease toward the first dielectric layer 611 or toward the bottom surface 12 of the packaging structure 10. In addition, the first dielectric layer 611 may define a plurality of openings 613 extending through the first dielectric layer 611 to expose portions of the bottommost circuit layer 621 of the redistribution layer 62. The topmost second dielectric layer 612 may cover the topmost circuit layer 621, and may define a plurality of openings (including, for example, openings 614 and openings 615) to expose portions of the topmost circuit layer 621. The bonding pads 66 may be disposed in the openings 614 of the topmost second dielectric layer 612 and on the exposed portions of the topmost circuit layer 621. The bonding pads 66 may protrude from a top surface of the redistribution structure 60.

The redistribution structure 60 may be also referred to as "a stacked structure" or "a high-density electronic structure" or "a high-density stacked structure." The redistribution layer 62 (including, for example, the three circuit layers 621) of the redistribution structure 60 may be also referred to as "a high-density redistribution layer."

In some embodiments, the packaging structure 10 may include a plurality of conductive pillars 15 spaced apart from each other. The conductive pillars 15 may be disposed in the openings 615 of the topmost second dielectric layer 612 and on the exposed portions of the topmost circuit layer 621. The location of the conductive pillars 15 may correspond to the high-density region 114 of the top surface 11 of the packaging structure 10. A material of the conductive pillar 15 may be, for example, copper, silver (Ag), gold (Au) or other high conductivity metals or alloy. In some embodiments, the material of the conductive pillar 15 is copper. Each of the conductive pillars 15 has a top surface 151 and may include an upper portion 153 and a lower portion 154 below the upper portion 153.

The electronic component 16 may be a semiconductor element such as a semiconductor die, and may be disposed adjacent to and electrically connected to the redistribution structure 60. The electronic component 16 has an upper surface 161 (e.g., back side surface), a lower surface 162 (e.g., active surface) opposite to the upper surface 161, and a lateral surface 163 extending between the upper surface 161 and the lower surface 162. The electronic component 16 and may include a plurality of conductive bumps 165 disposed adjacent to the lower surface 162. The conductive bumps 165 may protrude from the lower surface 162. A material of the conductive bump 165 may be, for example, copper (Cu), gold (Au), aluminum (Al), lead (Pb) or other metals or alloy. In some embodiments, the conductive bumps 165 of the electronic component 16 may be bonded to the bonding pads 66 of the redistribution structure 60 through a bonding material 95 such as soldering material.

In some embodiments, the conductive pillars 15 may be disposed adjacent to the electronic component 16. Alternatively, the conductive pillars 15 may be disposed surround or around the electronic component 16. A conductivity of each of the conductive pillars 15 may be greater than a conductivity of the conductive bump 165 (i.e., Al pad) of the electronic component 16. Further, the upper surface 161 of the electronic component 16 may be substantially coplanar with the top surface 151 of each of the conductive pillars 15.

The underfill 17 is disposed on the redistribution structure 60 to cover the bonding pads 66 of the redistribution structure 60, the bonding material 95 and a portion (e.g., the conductive bumps 165, the lower surface 162 and the lateral surface 163) of the electronic component 16. In some embodiments, a top surface 171 of the underfill 17 may be substantially aligned with or coplanar with the upper surface 161 of the electronic component 16 and the top surface 151 of each of the conductive pillars 15.

The encapsulant 18 may be disposed on the top surface of the redistribution structure 60 to encapsulate a portion of each of the conductive pillars 15, a portion of the underfill 17, the electronic component 16 and the redistribution structure 60. A material of the encapsulant 18 may be a molding compound with or without fillers. The encapsulant 18 has an upper surface 181 and a lower surface 182 opposite to the upper surface 181. In some embodiments, the upper surface 181 of the encapsulant 18 may be substantially aligned with or coplanar with the upper surface 161 of the electronic component 16, the top surface 151 of each of the conductive pillars 15 and the top surface 171 of the underfill 17. Thus, the upper surface 161 of the electronic component 16 may be exposed from the top surface 171 of the underfill 17 and the upper surface 181 of the encapsulant 18. In addition, the top surface 11 of the packaging structure 10 may include the upper surface 181 of the encapsulant 18, the upper surface 161 of the electronic component 16, the top surfaces 151 of the conductive pillars 15 and the top surface 171 of the underfill 17.

The conductive pillars 15 may extend through the encapsulant 18. A portion of the lower portion 154 of each of the conductive pillars 15 may be disposed in the openings 615 of the topmost second dielectric layer 612 of the redistribution structure 60, and on the exposed portions of the topmost circuit layer 621.

The electrical connectors 80 (e.g., solder balls or solder bumps) may be attached to the bottom surface of the redistribution structure 60 (i.e., the top surface 11 of the packaging structure 10). The electrical connectors 80 may be disposed in the openings 613 of the first dielectric layer 611 of the redistribution structure 60 and electrically connected to the exposed portions of the bottommost circuit layer 621 of the redistribution layer 62 of the redistribution structure 60 for external connection.

The circuit pattern structure 20 may be disposed over and electrically connected to the packaging structure 10 through the conductive connectors 50. Thus, the conductive connector 50 electrically connects the circuit pattern structure 20 and the packaging structure 10. A gap 40 is formed between the circuit pattern structure 20 and the packaging structure 10. The gap 40 includes a first portion 41 and a second portion 42 outside the first portion 41. The first portion 41 is closer to a lateral surface 29 of the circuit pattern structure 20 than the second portion 42 is. The first portion 41 may be a high-density portion, and the second portion 42 may be a low-density portion. A distribution density of the conductive connectors 50 in the low-density portion 42 is less than a distribution density of the conductive connectors 50 in the high-density portion 41. As shown in FIG. 1, a number of the conductive connectors 50 in a unit area in the first portion 41 may be greater than a number of the conductive connectors 50 in an equal unit area in the second portion 42. In some embodiments, the number of the conductive connectors 50 in the equal unit area in the second portion 42 may be zero. Further, a pitch between the conductive connectors 50 in the first portion 41 may be less than a pitch between the conductive connectors 50 in the second portion 42. Thus, an electrical connection between the circuit pattern structure 20 and the packaging structure 10 may be located in and extend through the first portion 41, and the first portion 41 may accommodate the electrical connection between the circuit pattern structure 20 and the packaging structure 10. In addition, the second portion 42 corresponds to the electronic component 16. There may be no electrical connection extending through the second portion 42.

The circuit pattern structure 20 may be, for example, a wiring structure, a substrate interposer, or a package structure. The circuit pattern structure 20 may include at least one dielectric layer (including, for example, one upper dielectric layer 23 and one lower dielectric layer 26) and at least one circuit layer (including, for example, one upper circuit layer 24 and one lower circuit layer 27 formed of a metal, a metal alloy, or other conductive material) in contact with the dielectric layer (e.g., the upper dielectric layer 23 and the lower dielectric layer 26). In some embodiments, the circuit pattern structure 20 may be similar to a core substrate that further includes a core portion 25, and may be in a wafer type, a panel type or a strip type. As shown in FIG. 1, the circuit pattern structure 20 has a bottom surface 21 facing the packaging structure 10, a top surface 22 opposite to the bottom surface 21, and a lateral surface 29 extending between the top surface 22 and the bottom surface 21.

As shown in FIG. 1, the circuit pattern structure 20 includes a plurality of dielectric layers (for example, the upper dielectric layer 23 and the lower dielectric layer 26), a plurality of circuit layers (for example, the upper circuit layer 24 and the lower circuit layer 27) and a plurality of bonding pads 28. The upper circuit layer 24 may be a patterned circuit layer that is in contact with the upper dielectric layer 23, and may include at least one trace 241 and a plurality of connecting pads 242. The upper circuit layer 24 may be disposed on the top surface of the core portion 25 and covered by the upper dielectric layer 23. Further, the upper dielectric layer 23 may define a plurality of openings 232 extending through the upper dielectric layer 23 to expose portions of the connecting pads 242. The bonding pads 28 may be disposed in the openings 232 of the upper dielectric layer 23 and on the exposed portions of the connecting pads 242. The bonding pad 28 may include an under-bump metallurgy (UBM). Alternatively, the bonding pads 28 may be omitted. In addition, the lower circuit layer 27 may be a patterned circuit layer that is in contact with the lower dielectric layer 26, and may include at least one trace 271 and a plurality of connecting pads 272. The lower circuit layer 27 may be disposed on the bottom surface of the core portion 25 and covered by the lower dielectric layer 26.

Further, the lower dielectric layer 26 may define a plurality of openings 262 extending through the lower dielectric layer 26 to expose portions of the connecting pads 272.

The circuit pattern structure 20 may be also referred to as "a stacked structure" or "a low-density electronic structure" or "a low-density stacked structure". The circuit layer (including, for example, the upper circuit layer 24 and the lower circuit layer 27) of the circuit pattern structure 20 may be also referred to as "a low-density circuit layer". In some embodiments, a density of a circuit line (including, for example, a trace or a pad) of the high-density redistribution layer (e.g., the redistribution layer 62 of the redistribution structure 60) is greater than a density of a circuit line of a low-density circuit layer (e.g., the circuit layer of the circuit pattern structure 20). That is, the count of the circuit line (including, for example, a trace or a pad) in a unit area of the high-density redistribution layer is greater than the count of the circuit line in an equal unit area of the low-density circuit layer, such as about 1.2 times or greater, about 1.5 times or greater, or about 2 times or greater, or about 5 times or greater. Alternatively, or in combination, a line width/line space (L/S) of the high-density redistribution layer is less than an L/S of the low-density circuit layer, such as about 90% or less, about 50% or less, or about 20% or less.

The conductive connectors 50 may be, for example, reflowable connectors. A material of the conductive connector 50 may be a solder material. The conductive connectors 50 may physically connect and electrically connect the circuit pattern structure 20 to the packaging structure 10. The conductive connectors 50 may be disposed on the top surface 11 of the packaging structure 10 and squashed on the conductive pillars 15. Each of the conductive connectors 50 may be in contact with the upper portion 153 of each of the conductive pillars 15.

In some embodiments, each of the conductive connectors 50 may include a base portion 51 and an extending portion 52 below the base portion 51. The base portion 51 may extend in the opening 262 of the lower dielectric layer 26 of the circuit pattern structure 20 and on the exposed portion of the connecting pads 272. The base portion 51 may taper upward. That is, a width of base portion 51 may gradually increase toward the extending portion 52 and the conductive pillar 15.

The extending portion 52 may be between the base portion 51 and the conductive pillar 15 and squashed on the top surface 151 of the conductive pillar 15. In some embodiments, the extending portion 52 may be squashed in a disk shape. The extending portion 52 may cover a portion of the bottom surface 21 of the circuit pattern structure 20. That is, a width of the extending portion 52 may be greater than a width (e.g., a maximum width) of the base portion 51. In some embodiments, the width of the extending portion 52 may be greater than a thickness thereof. Further, the width of the extending portion 52 may be less than a width of the conductive pillar 15. Alternatively, the width of the extending portion 52 may be greater than the width of the conductive pillar 15. In some embodiments, the extending portion 52 may cover a portion of the upper surface 181 of the encapsulant 18. That is, there may be an interference or a boundary between the extending portion 52 of the conductive connector 50 and the encapsulant 18.

In some embodiments, a sidewall of the extending portion 52 may curve outward. The sidewall of the extending portion 52 may include at least one inflection point. That is, the sidewall of the extending portion 52 may include at least one convex portion and at least one concave portion. In some embodiments, a profile of a lateral surface of the extending portion 52 may be not substantially symmetrical. That is, the profile of the lateral surface of the right side of the extending portion 52 may be different from the profile of the lateral surface of the left side of the extending portion 52.

The underfill 30 is disposed in the gap 40 or the space between the packaging structure 10 and the circuit pattern structure 20, and may be around the conductive connectors 50. For example, the underfill 30 may be interposed between the packaging structure 10 and the circuit pattern structure 20 to cover and encapsulate the conductive connectors 50. The underfill 30 may be also referred to as "a protection layer." In some embodiments, the underfill 30 may be further disposed on the upper surface 181 of the encapsulant 18 and on the upper surface 161 of the electronic component 16. As shown in FIG. 1, the underfill 30 may fill the gap 40 or the space between the packaging structure 10 and the circuit pattern structure 20. However, in other embodiments, the underfill 30 may not fill the gap 40 or the space between the packaging structure 10 and the circuit pattern structure 20, and the underfill 30 may define at least one opening extending through the underfill 30 to expose the upper surface 161 of the electronic component 16. In some embodiments, the opening of the underfill 30 may further expose a portion of the upper surface 181 of the encapsulant 18. The underfill 30 may include at least one filler 31.

The protrusion structure 7 may be also referred to as "a capillary structure", "a support structure", or "an engagement structure." The protrusion structure 7 is disposed in a narrowest portion 43 (or narrow portion) of the gap 40, and is configured to allow the underfill 30 to flow or extend therethrough by capillarity. Thus, the protrusion structure 7 is configured to facilitate the distributing of the underfill 30 in the gap 40. The narrowest portion 43 (or narrow portion) of the gap 40 may be the center portion of the gap 40, and may be in the second portion 42 of the gap 40. The protrusion structure 7 may be located adjacent to a center region of the circuit pattern structure 20. As shown in FIG. 1, the protrusion structure 7 is disposed in the second portion 42 of the gap 40, and is configured to provide a standoff distance between the packaging structure 10 and the circuit pattern structure 20 and prevent the packaging structure 10 from contacting the circuit pattern structure 20. Thus, the protrusion structure 7 (e.g., the support structure 7) is configured to maintain the height of the second portion 42 greater than a diameter of the filler 31 of the underfill 30. As a result, the minimum height of the second portion 42 of the gap 40 is greater than a diameter of the filler 31 of the underfill 30, and the protrusion structure 7 (e.g., the capillary structure 7) is configured to facilitate the underfill 30 to flow through the second portion 42 of the gap 40.

As shown in FIG. 1, the protrusion structure 7 is disposed on the bottom surface 21 of the circuit pattern structure 20, and is disposed over the electronic component 16. Thus, the protrusion structure 7 protrudes from the circuit pattern structure 20 toward the packaging structure 10, and is configured to reduce a delamination between the underfill 30 and the circuit pattern structure 20. Further, the protrusion structure 7 is disposed between the conductive connectors 50. The protrusion structure 7 is farther to the lateral surface 13 of the packaging structure 10 (or the lateral surface 29 of the circuit pattern structure 20) than the conductive connectors 50 are. In addition, a portion of the underfill 30 is located between the protrusion structure 7 and the top surface 11 of the packaging structure 10. The protrusion structure 7 may include a plurality of protrusions 71 separated from each other and arranged in at least one array. The protrusions 71 are discrete, and a capillary channel 72 is defined by two adjacent protrusions 71. The capillary channel 72 is the space between two adjacent protrusions 71. In some embodiments, each of the protrusions 71 is in a dot shape, a hemisphere shape or a cylinder shape. The protrusion structure 7 may be dummy. That is, the protrusion structure 7 may be not a part of a circuit layer, and may not have electrical function.

In a manufacturing process, the underfill 30 is applied to the gap 40 after the circuit pattern structure 20 is physically connected to and electrically connected to the packaging structure 10. Thus, after the circuit pattern structure 20 is bonded to the conductive pillars 15 of the packaging structure 10 through the conductive connectors 50, the underfill 30 may be applied to around each of the conductive connectors 50 to cover and protect the small size conductive connectors 50, leading to increased yield of the electronic structure 1. In some embodiments, the gap 40 or the space between the circuit pattern structure 20 and the packaging structure 10 may be less than or equal to 20 μm, thus, it is difficult to form the underfill 30 through capillary attraction without the protrusion structure 7. In a manufacturing process, the underfill 30 is applied to at least one end of the gap 40 that is near the lateral surface 29 of the circuit pattern structure 20. Since the gap 40 or the space between the circuit pattern structure 20 and the packaging structure 10 is very narrow, the flow of the underfill 30 may be limited or restricted without the protrusion structure 7. For example, the underfill 30 may not flow from the right side of the gap 40 to the left side of the gap 40 completely, or the underfill 30 may not flow to reach to the center of the gap 40. Thus, the underfill 30 may not fulfill the gap 40 or the space between the packaging structure 10 and the circuit pattern structure 20. To address such concern, the illustrated embodiment of the present disclosure may provide the protrusion structure 7 to facilitate the capillary attraction of the underfill 30. For example, the underfill 30 may flow from the right side of the gap 40 to the left side of the gap 40 through the capillary channel 72, or the underfill 30 may flow to reach to the center of the gap 40 through the capillary channel 72. Thus, the underfill 30 may fulfill the gap 40 or the space between the packaging structure 10 and the circuit pattern structure 20. Thus, the underfill 30 may encapsulate the protrusion structure 7 and the conductive connectors 50.

Figure 2:
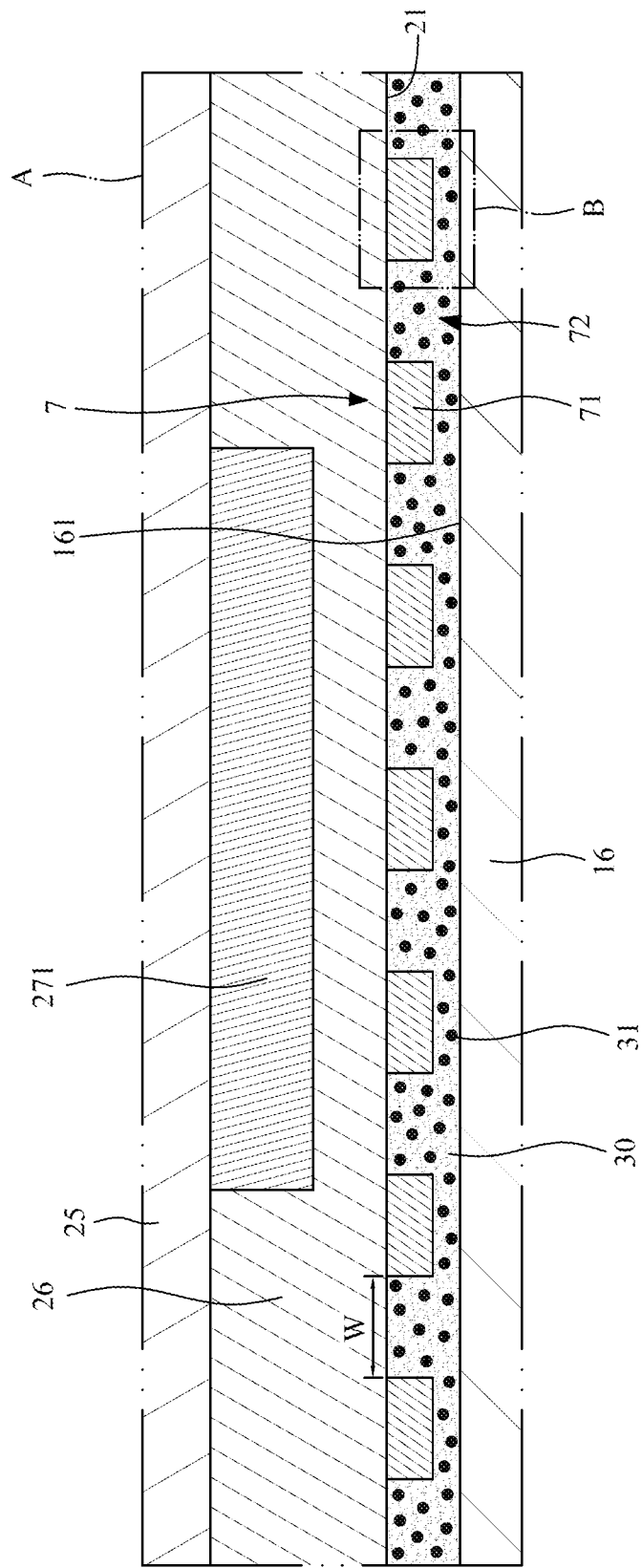
FIG. 2 illustrates an enlarged view of an area "A" of FIG. 1.

FIG. 2 illustrates an enlarged view of an area "A" of FIG. 1. The width W of a space between two adjacent protrusions 71 (i.e., the capillary channel 72) is greater than a diameter of the filler 31 of the underfill 30. Thus, the filler 31 of the underfill 30 may be located between the protrusions 71.

Figure 2A:
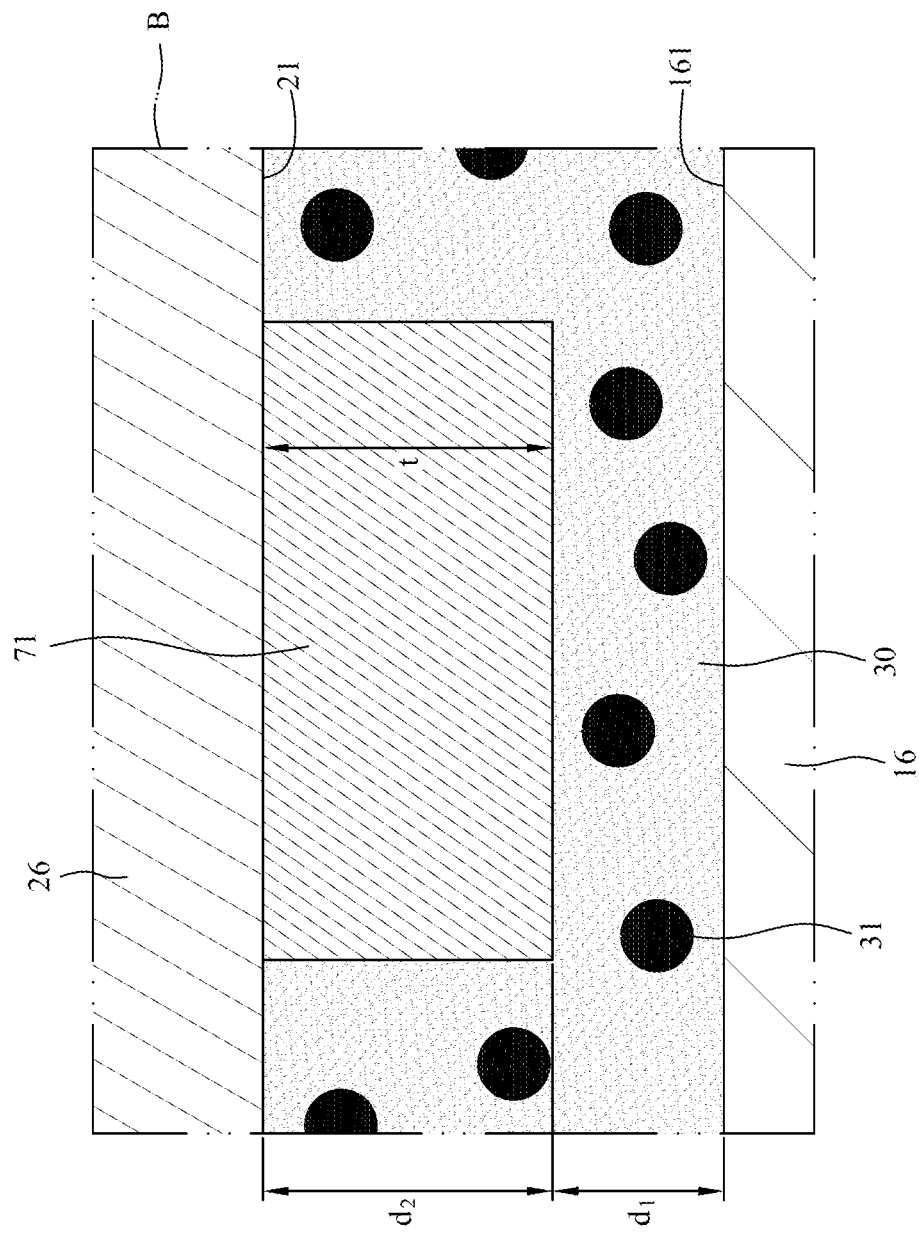
FIG. 2A illustrates an enlarged view of an area "B" of FIG. 2.

FIG. 2A illustrates an enlarged view of an area "B" of FIG. 2. A vertical distance $d_1$ between a bottom surface of the protrusion 71 of the protrusion structure 7 and a top surface 11 of the packaging structure 10 (i.e., the upper surface 161 of the electronic component 16) is less than a vertical distance $d_2$ between the bottom surface of the protrusion 71 of the protrusion structure 7 and the bottom surface 21 of the circuit pattern structure 20. In addition, a thickness t of one of the protrusions 71 is greater than the diameter of the filler 31 of the underfill 30.

Figure 3:
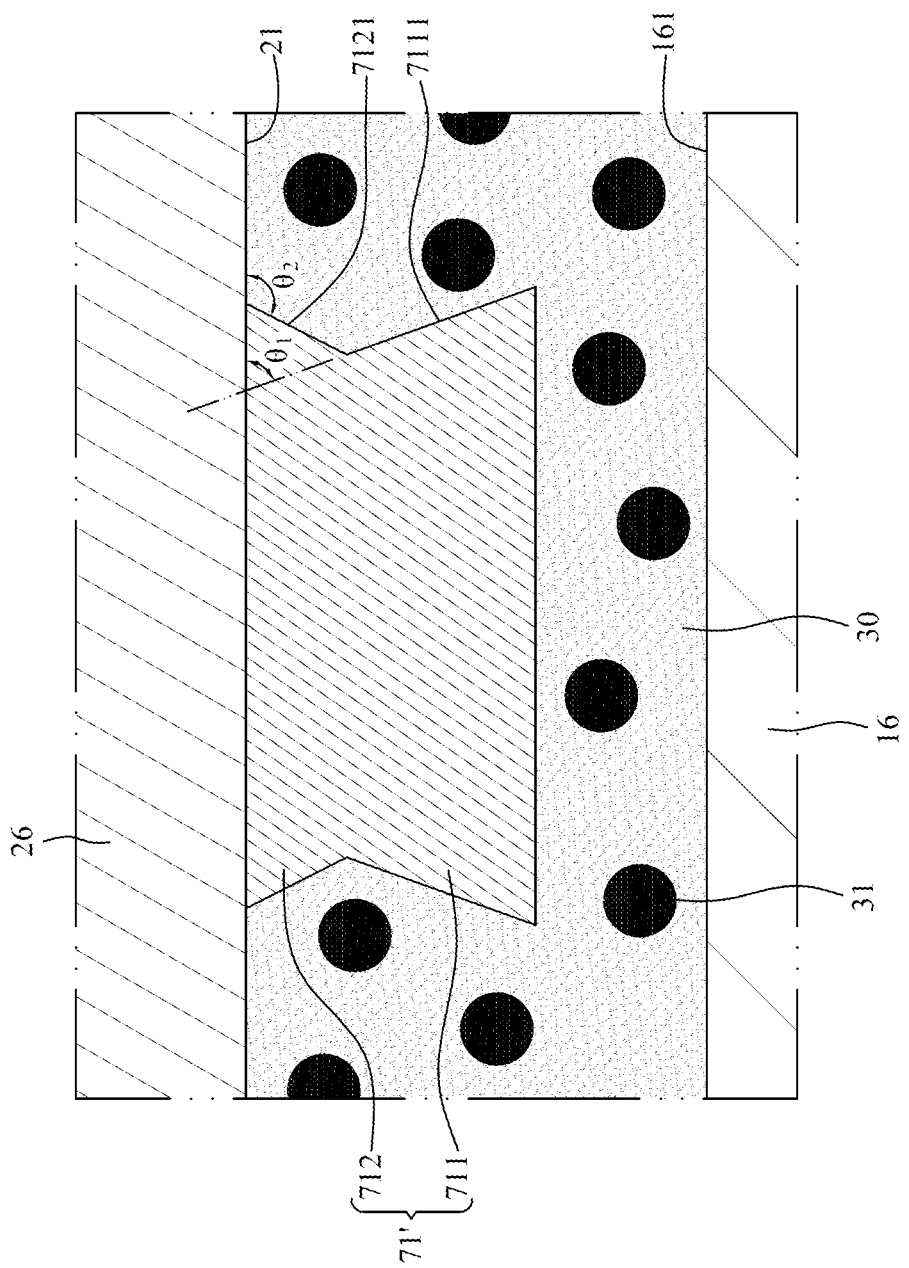
FIG. 3 illustrates a cross-sectional view of a protrusion according to some embodiments of the present disclosure.

FIG. 3 illustrates a cross-sectional view of a protrusion 71' according to some embodiments of the present disclosure. The protrusion 71' includes a first portion 711 and a second portion 712 located between the first portion 711 and the bottom surface 21 of the circuit pattern structure 20. An angle $\theta_1$ between a lateral surface 7111 of the first portion 711 and the bottom surface 21 of the circuit pattern structure 20 is an acute angle. An angle $\theta 2$ between a lateral surface 7121 of the second portion 712 and the bottom surface 21 of the circuit pattern structure 20 is an obtuse angle. Both the lateral surface 7111 of the first portion 711 and the lateral surface 7121 of the second portion 712 may be substantially flat surface. A maximum width of the first portion 711 may be greater than a maximum width of the second portion 712.

Figure 4:
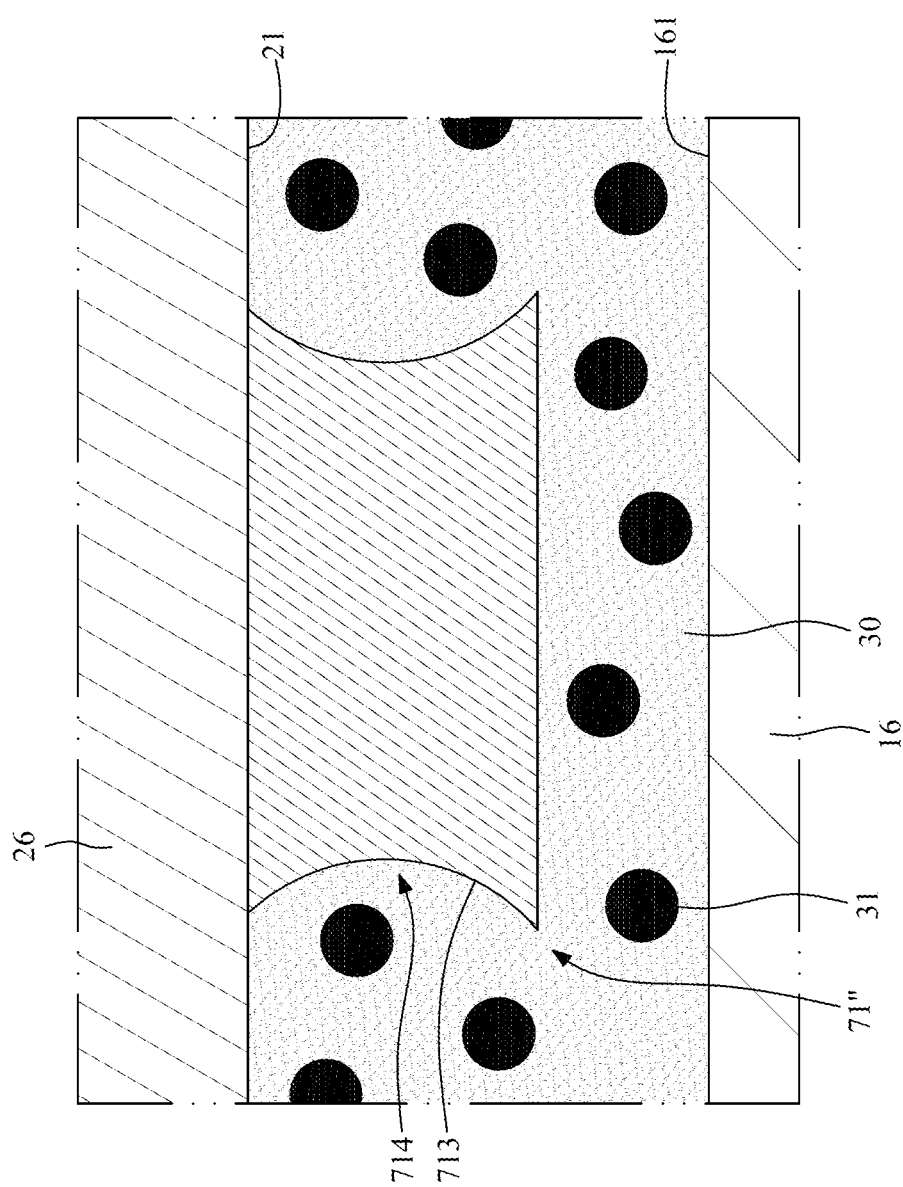
FIG. 4 illustrates a cross-sectional view of a protrusion according to some embodiments of the present disclosure.

FIG. 4 illustrates a cross-sectional view of a protrusion 71" according to some embodiments of the present disclosure. A lateral surface 713 of protrusion 71" may define a recess portion 714, and the underfill 30 may extend into the recess portion 714. The recess portion 714 (or the lateral surface 713) may include a curved surface.

Figure 5:
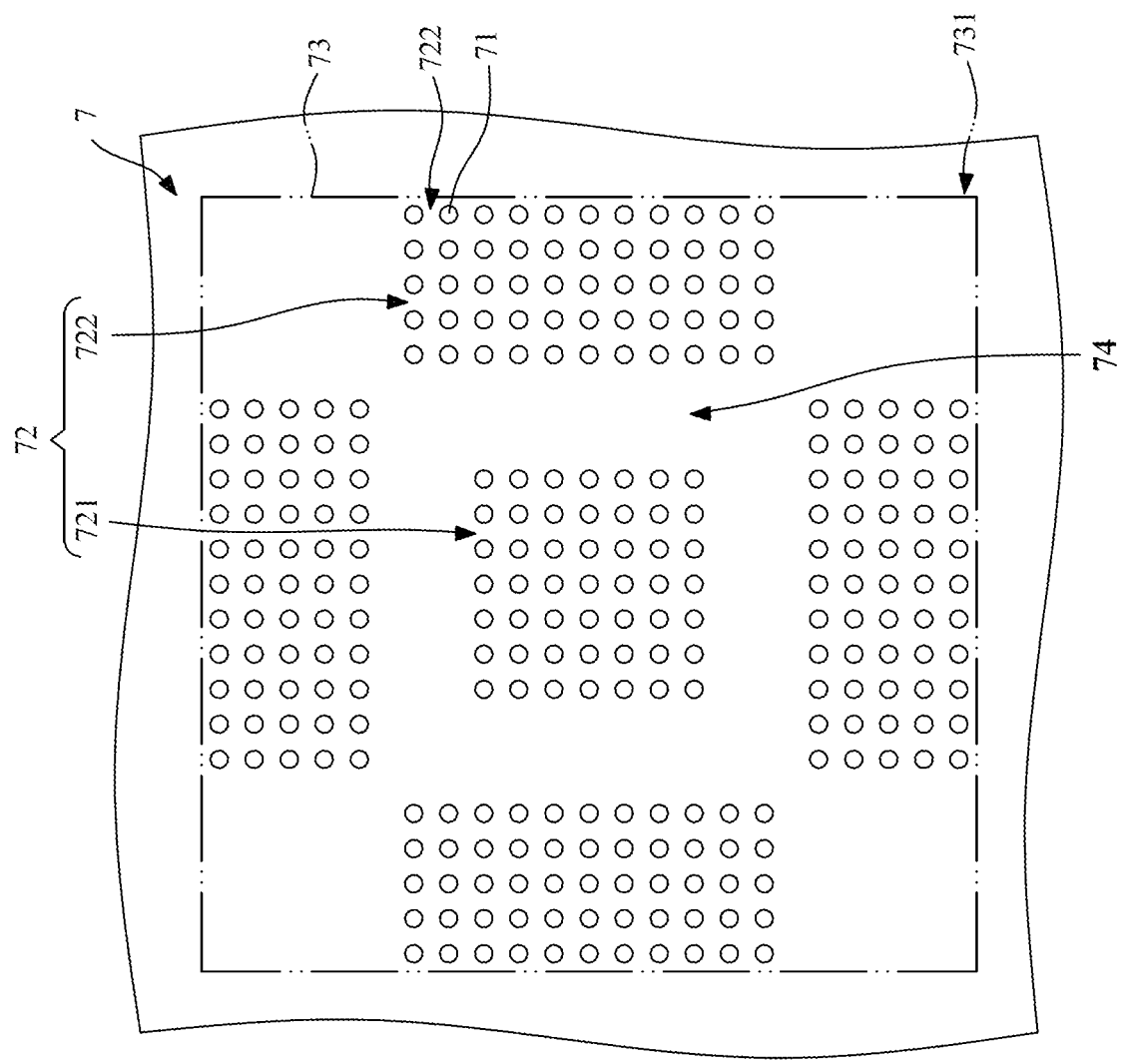
FIG. 5 illustrates a partially enlarged bottom view of the protrusion structure of FIG. 1.

FIG. 5 illustrates a partially enlarged bottom view of the protrusion structure 7 of FIG. 1. The protrusion structure 7 includes a patterned layer. At least one of the protrusions 71 has a substantially circular shape. The protrusions 71 are arranged in five arrays. The capillary channel 72 are located in a region 73, and include a plurality of first channels 721 near a center of the region 73 and a plurality of second channels 722 near a periphery of the region 73. A space 74 is between the arrays, and the space 74 surrounds and communicates with the first channels 721. Further, the width of the space 74 is greater than a width of the first channel 721 and a width of the second channel 722. As shown in FIG. 5, the space 74 extends to at least one corner 731 of the region 73.

Figure 5A:
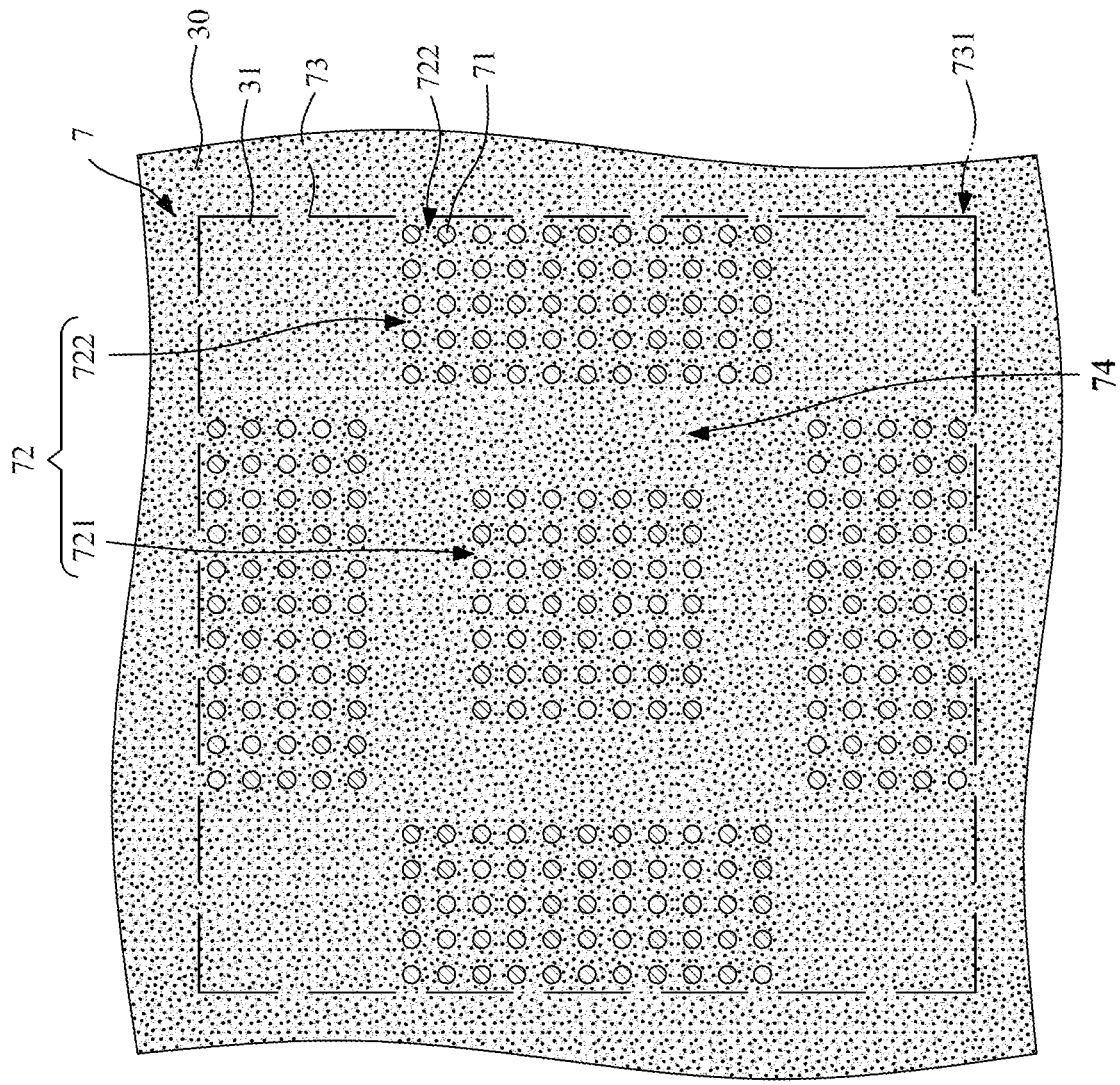
FIG. 5A illustrates a partially enlarged cross-sectional view of the protrusion structure and the underfill of FIG. 1.

FIG. 5A illustrates a partially enlarged cross-sectional view of the protrusion structure 7 and the underfill 30 of FIG. 1. The structure of FIG. 5A is similar to the structure of FIG. 5, except that the underfill 30 is included, and the protrusion structure 7 is a cross-sectional view. As shown in FIG. 5A, a diameter of one of the protrusions 71 is greater than the diameter of the filler 31 of the underfill 30. The width of the first channel 721 and the width of the second channel 722 are greater than the diameter of the filler 31 of the underfill 30. Thus, the filler 31 of the underfill 30 may be disposed in the first channel 721 and the second channel 722.

Figure 6:
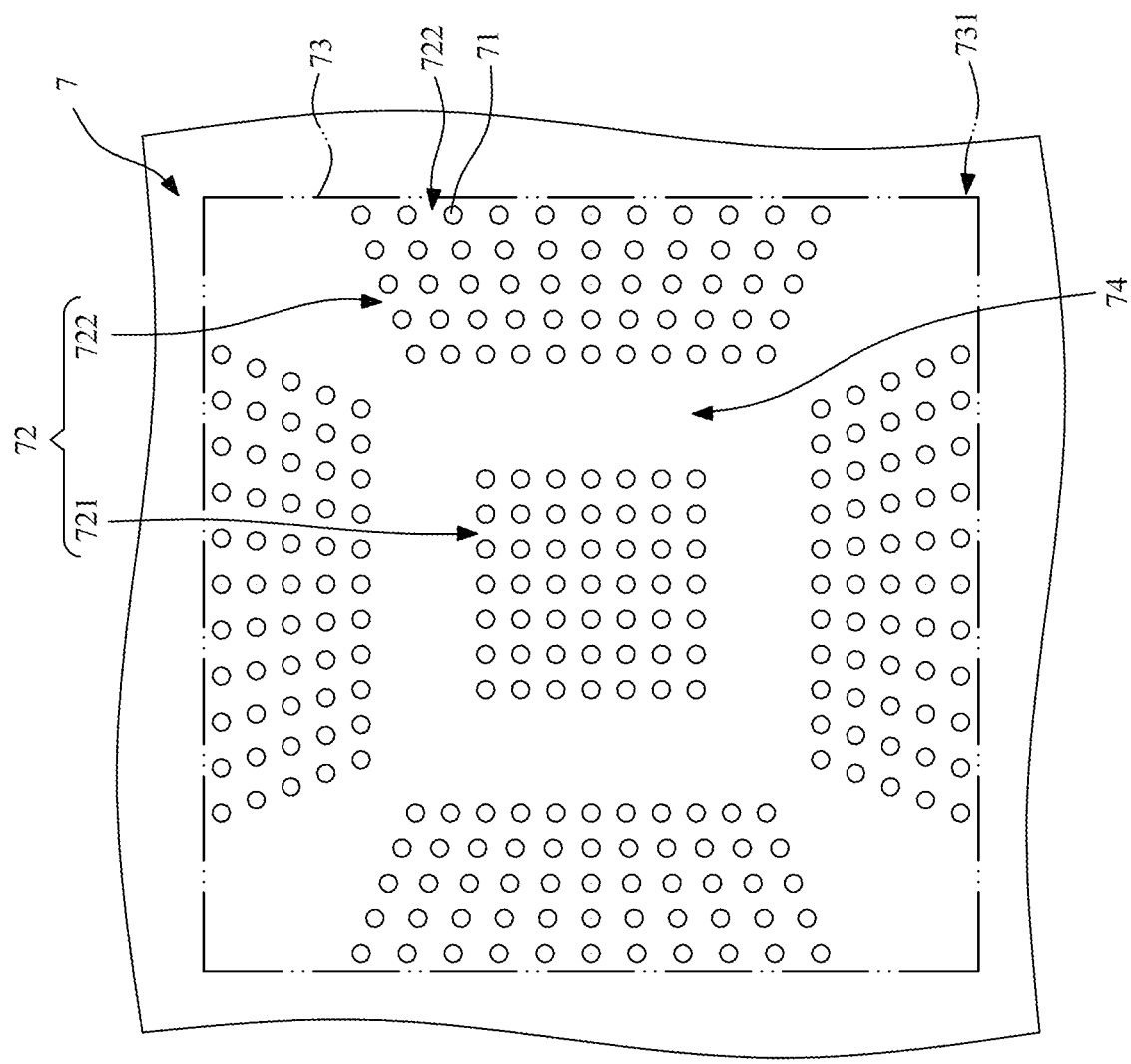
FIG. 6 illustrates another example of the protrusion structure of FIG. 5.

FIG. 6 illustrates another example of the protrusion structure 7 of FIG. 5. As shown in FIG. 6, a width of the second channel 722 may be greater than a width of the first channel 721. Further, a width of the second channel 722 may increase gradually toward the periphery of the region 73.

Figure 7:
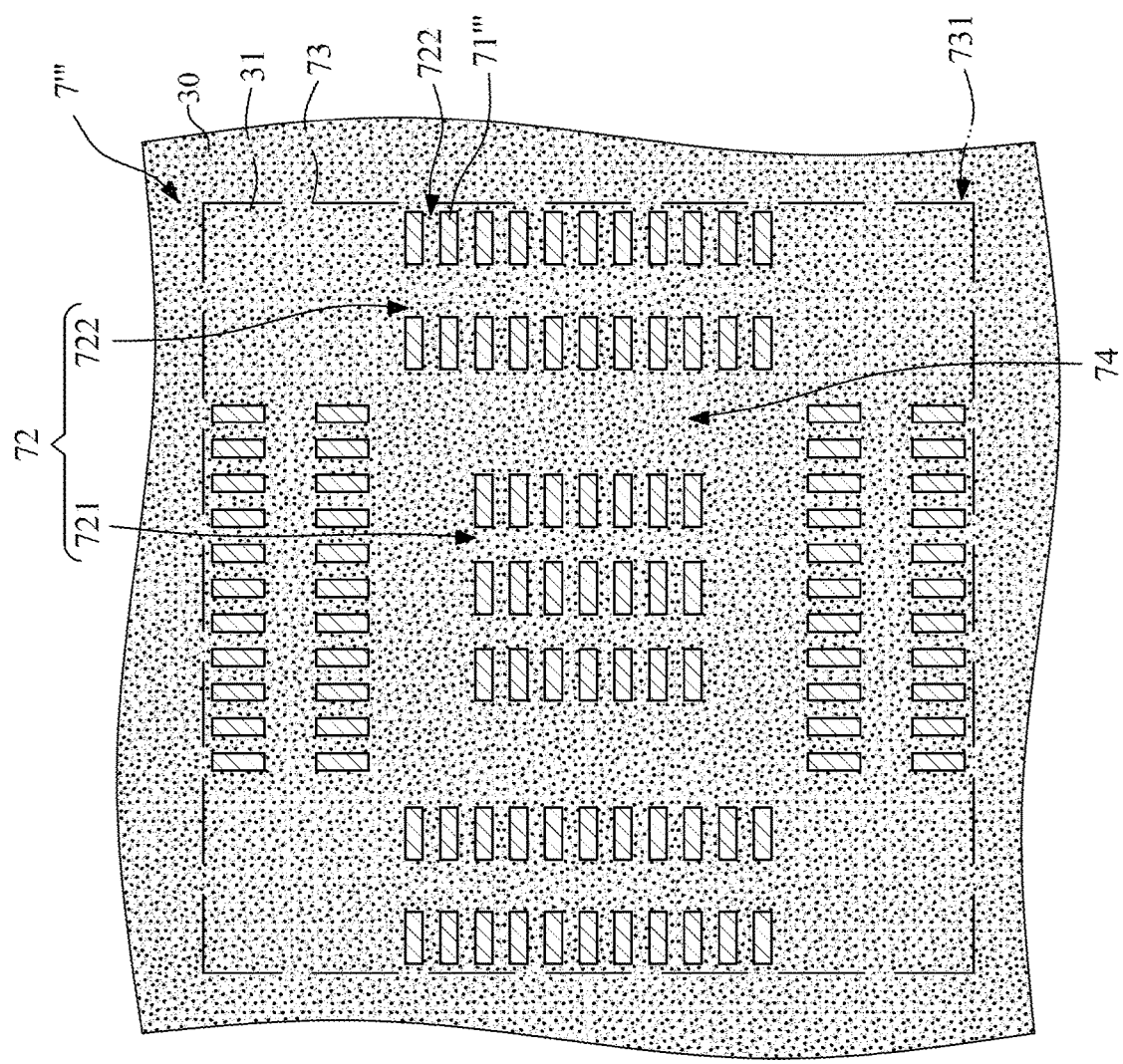
FIG. 7 illustrates a partially enlarged cross-sectional view of a protrusion structure and the underfill according to some embodiments of the present disclosure.

FIG. 7 illustrates a partially enlarged cross-sectional view of a protrusion structure 7''' and the underfill 30 according to some embodiments of the present disclosure. The structure of FIG. 7 is similar to the structure of FIG. 5A, except that at least one of the protrusions 71''' has an elongated shape such as a substantially rectangular shape.

Figure 8:
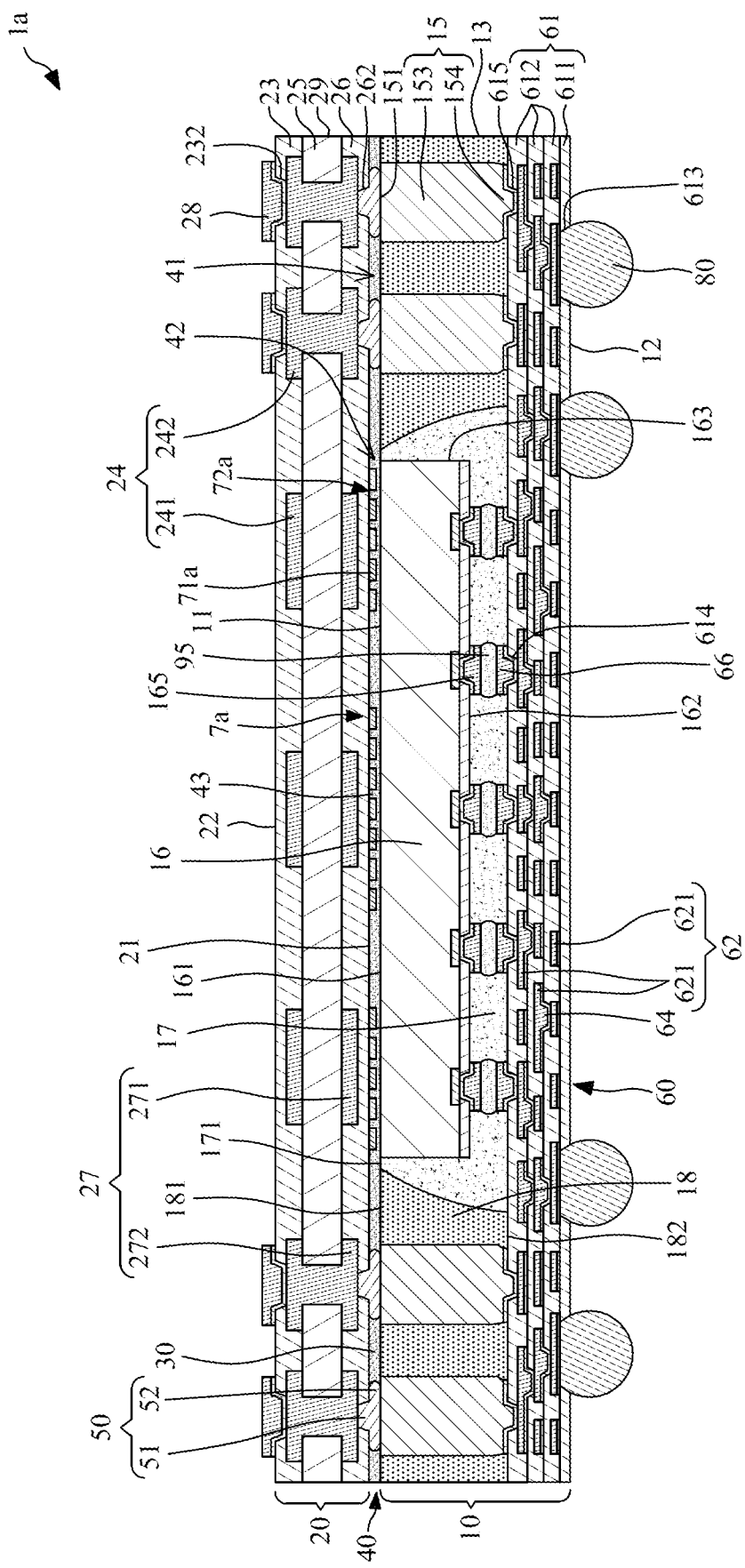
FIG. 8 illustrates a cross-sectional view of an electronic structure according to some embodiments of the present disclosure.
Figure 9:
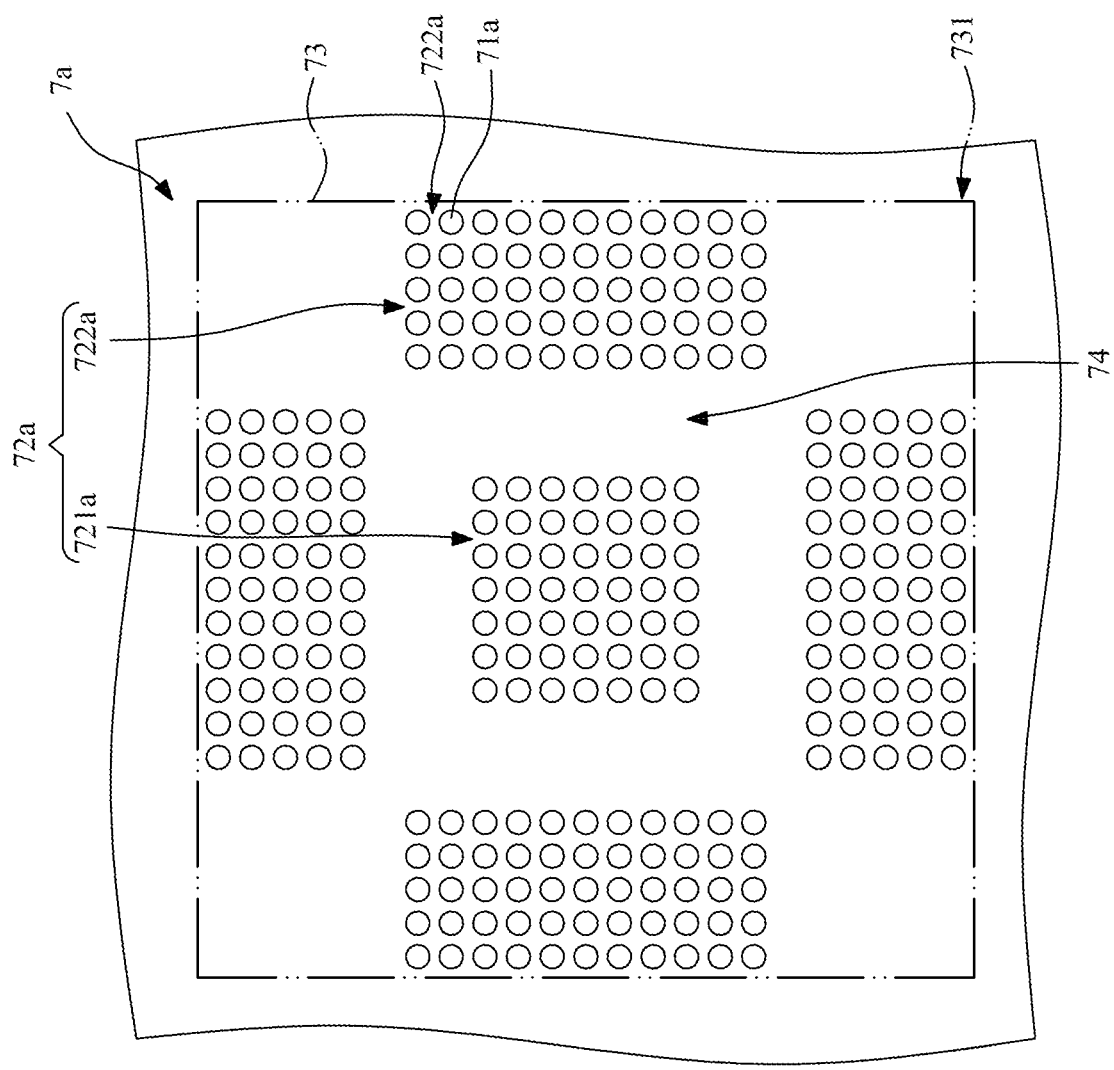
FIG. 9 illustrates a partially enlarged bottom view of the protrusion structure of FIG. 8.

FIG. 8 illustrates a cross-sectional view of an electronic structure 1a according to some embodiments of the present disclosure. FIG. 9 illustrates a partially enlarged bottom view of the protrusion structure 7a of FIG. 8. The electronic structure 1a of FIG. 8 and FIG. 9 is similar to the electronic structure 1 of FIG. 1 and FIG. 5, except for a structure of the protrusion structure 7a. The diameter of the protrusion 71a of the protrusion structure 7a of FIG. 8 and FIG. 9 is greater than the diameter of the protrusion 71 of the protrusion structure 7 of FIG. 1 and FIG. 5. The width of the capillary channel 72a (including the first channels 721a and the second channels 722a) of FIG. 8 and FIG. 9 is less than the width of the capillary channel 72 (including the first channels 721 and the second channels 722) of FIG. 1 and FIG. 5. As shown in FIG. 8 and FIG. 9, the width of the capillary channel 72a (including the first channels 721a and the second channels 722a) is less than the diameter of the protrusion 71a.

Figure 10:
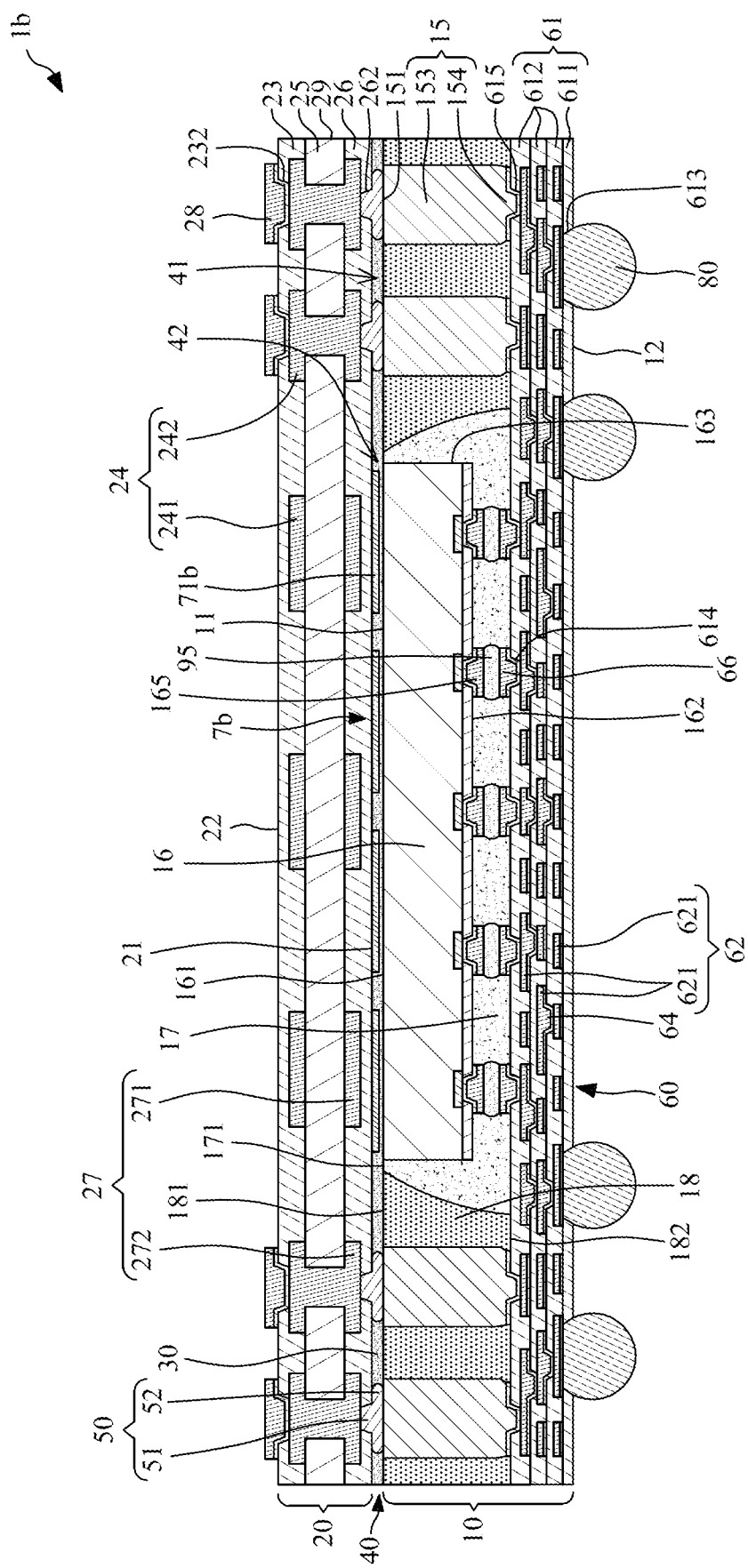
FIG. 10 illustrates a cross-sectional view of an electronic structure according to some embodiments of the present disclosure.

FIG. 10 illustrates a cross-sectional view of an electronic structure 1b according to some embodiments of the present disclosure. The electronic structure 1b of FIG. 10 is similar to the electronic structure 1 of FIG. 1, except for a structure of the protrusion structure 7b. As shown in FIG. 10, a width of the protrusion 71b of the protrusion structure 7b is greater than a width of the extending portion 52 of the conductive connector 50. In addition, a width of the protrusion 71b of the protrusion structure 7b is greater than a width of the connecting pad 272 of the lower circuit layer 27.

Figure 11:
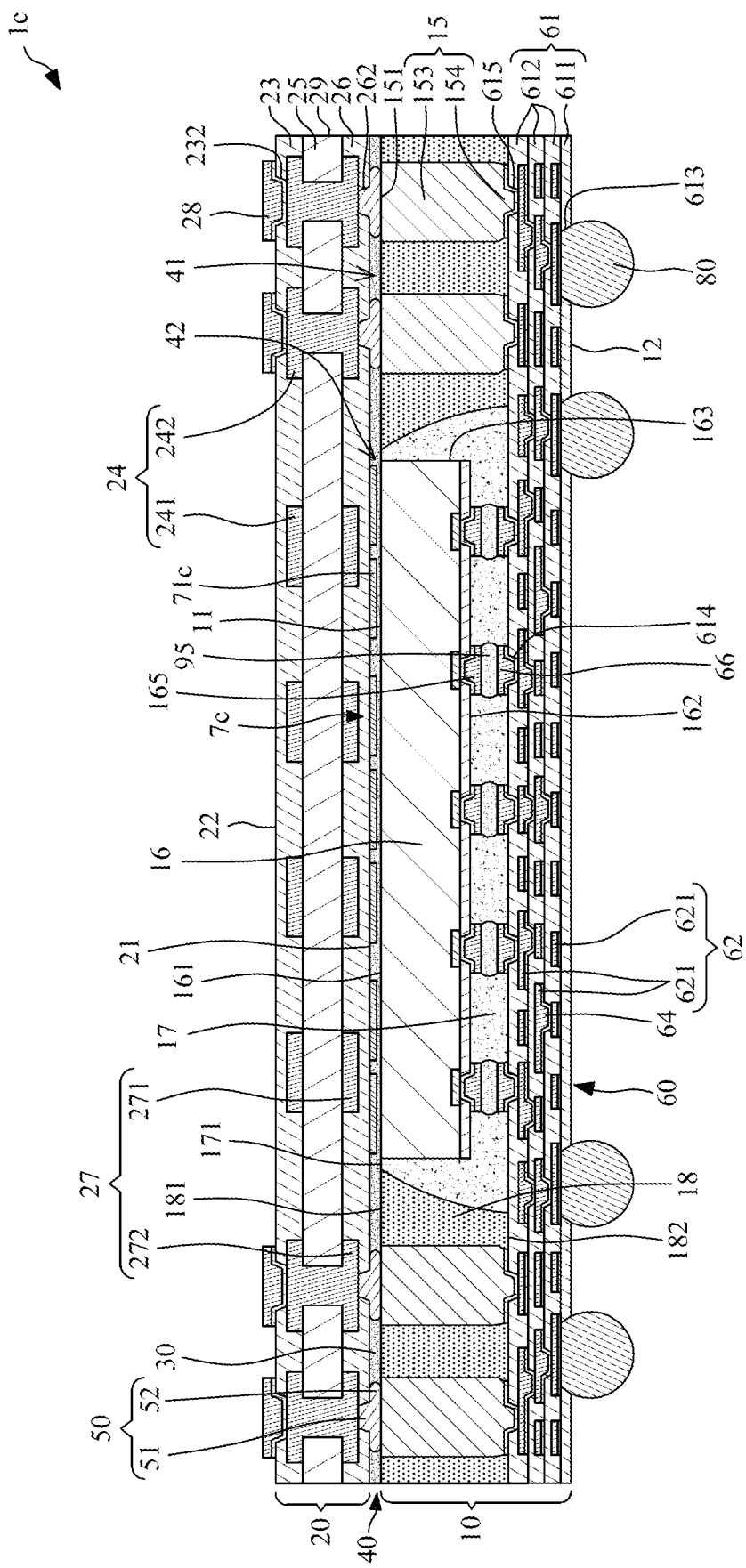
FIG. 11 illustrates a cross-sectional view of an electronic structure according to some embodiments of the present disclosure.

FIG. 11 illustrates a cross-sectional view of an electronic structure 1c according to some embodiments of the present disclosure. The electronic structure 1c of FIG. 11 is similar to the electronic structure 1b of FIG. 10, except for a structure of the protrusion structure 7c. As shown in FIG. 11, the protrusions 71c of the protrusion structure 7c may be arranged in a plurality of arrays.

Figure 12:
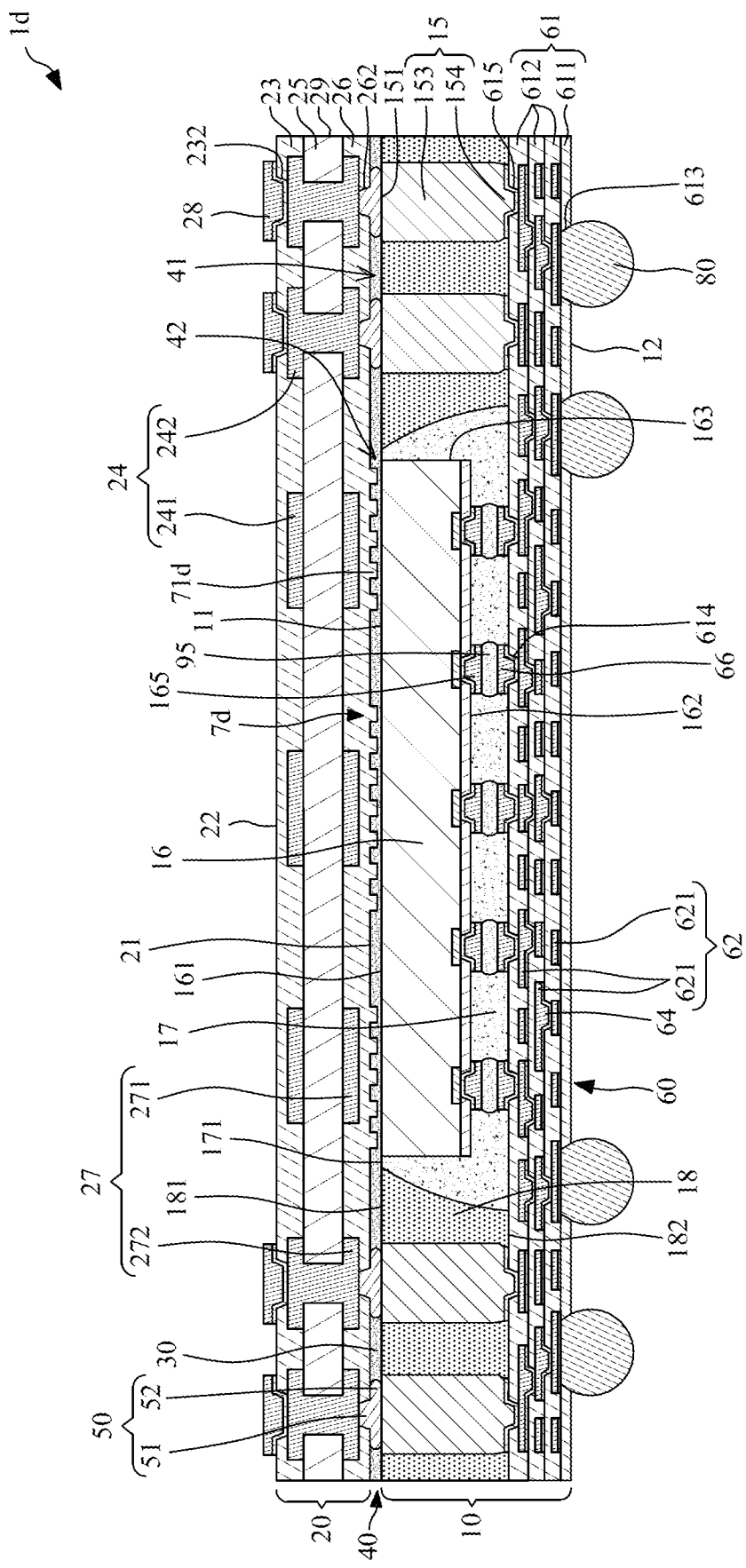
FIG. 12 illustrates a cross-sectional view of an electronic structure according to some embodiments of the present disclosure.

FIG. 12 illustrates a cross-sectional view of an electronic structure 1d according to some embodiments of the present disclosure. The electronic structure 1d of FIG. 12 is similar to the electronic structure 1 of FIG. 1, except for a structure of the protrusion structure 7d. As shown in FIG. 12, the protrusion structure 7d (including the protrusions 71d) and the lower dielectric layer 26 of the circuit pattern structure 20 are formed concurrently and integrally as a monolithic structure. That is, the protrusion structure 7d (including the protrusions 71d) is a part of the circuit pattern structure 20, and there is no boundary between the protrusion structure 7d (including the protrusions 71d) and the circuit pattern structure 20.

Figure 13:
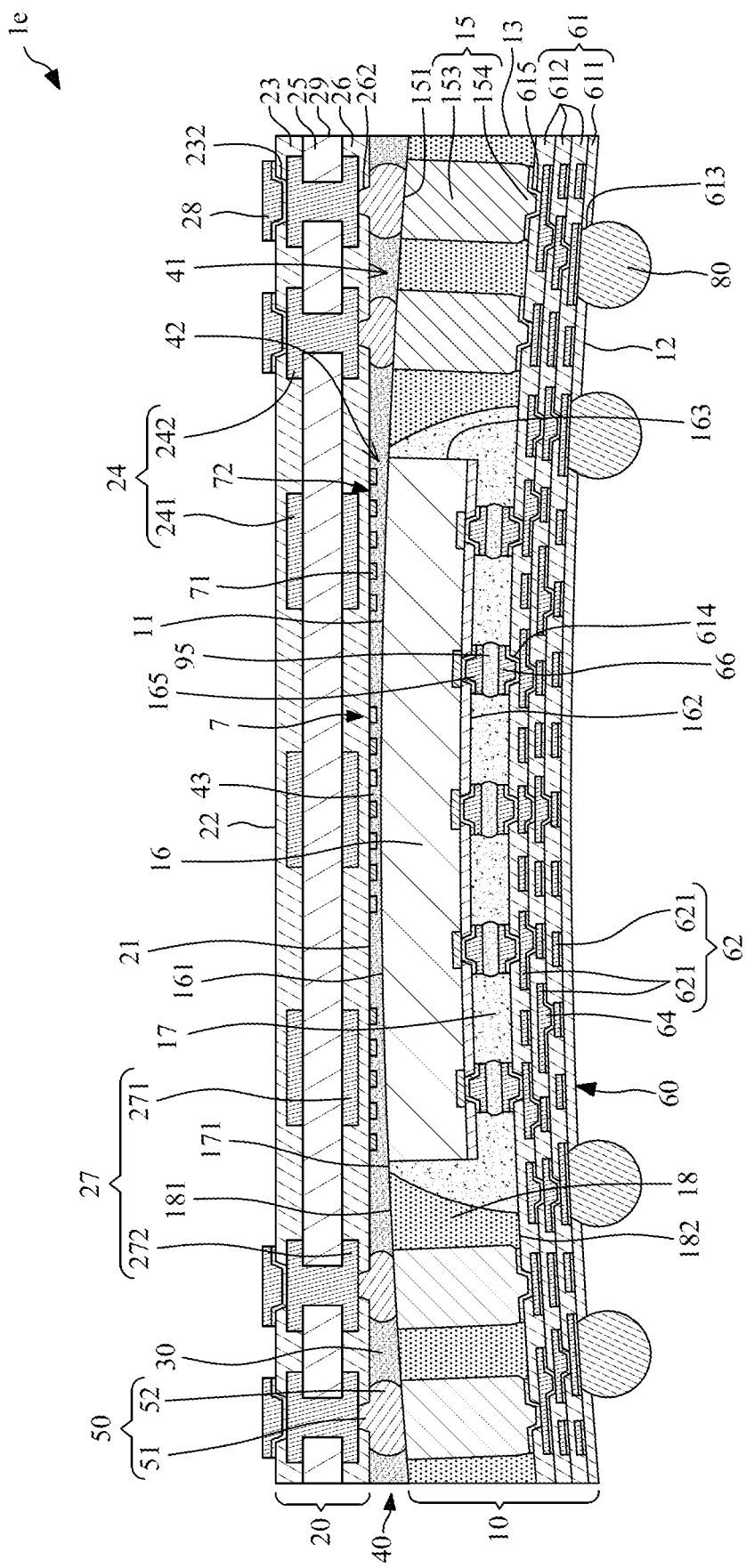
FIG. 13 illustrates a cross-sectional view of an electronic structure according to some embodiments of the present disclosure.

FIG. 13 illustrates a cross-sectional view of an electronic structure 1e according to some embodiments of the present disclosure. The electronic structure 1e of FIG. 13 is similar to the electronic structure 1 of FIG. 1, except that the packaging structure 10 has a warpage. As shown in FIG. 13, the packaging structure 10 is convex toward the circuit pattern structure 20. Thus, the height of the gap 40 gradually increases toward a lateral surface 29 of the circuit pattern structure 20, and the center portion of the gap 40 is the narrowest portion 43 of the gap 40. As shown in FIG. 13, the first portion 41 is closer to a lateral surface 29 of the circuit pattern structure 20 than the second portion 42 is, and a height of the first portion 41 is greater than a height of the second portion 42

Figure 14:
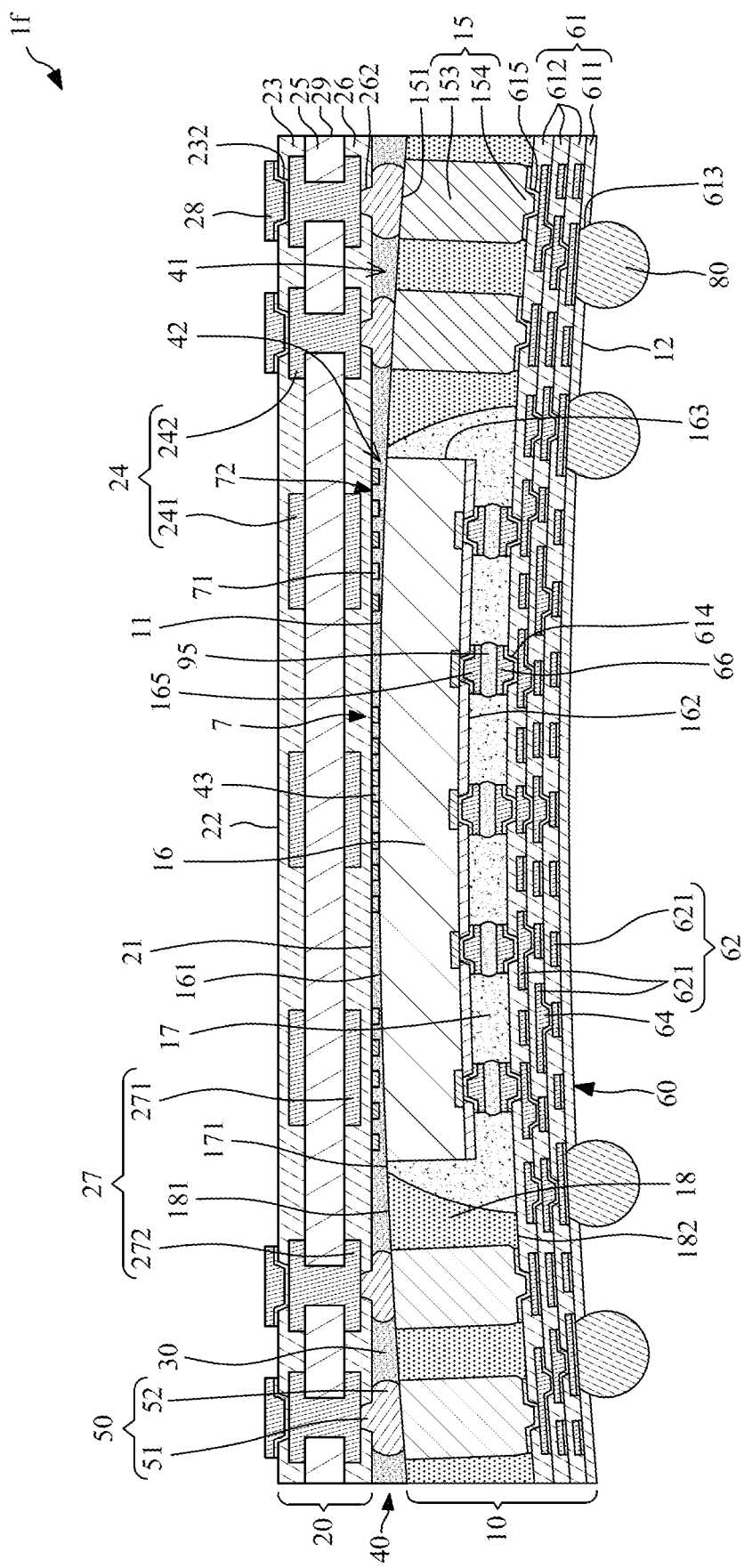
FIG. 14 illustrates a cross-sectional view of an electronic structure according to some embodiments of the present disclosure.

FIG. 14 illustrates a cross-sectional view of an electronic structure if according to some embodiments of the present disclosure. The electronic structure if of FIG. 14 is similar to the electronic structure 1e of FIG. 13, except that the protrusion structure 7 contacts the packaging structure 10. For example, the protrusion 71 in the center portion of the gap 40 (or the narrowest portion 43 of the gap 40) contacts the packaging structure 10.

Figure 15:
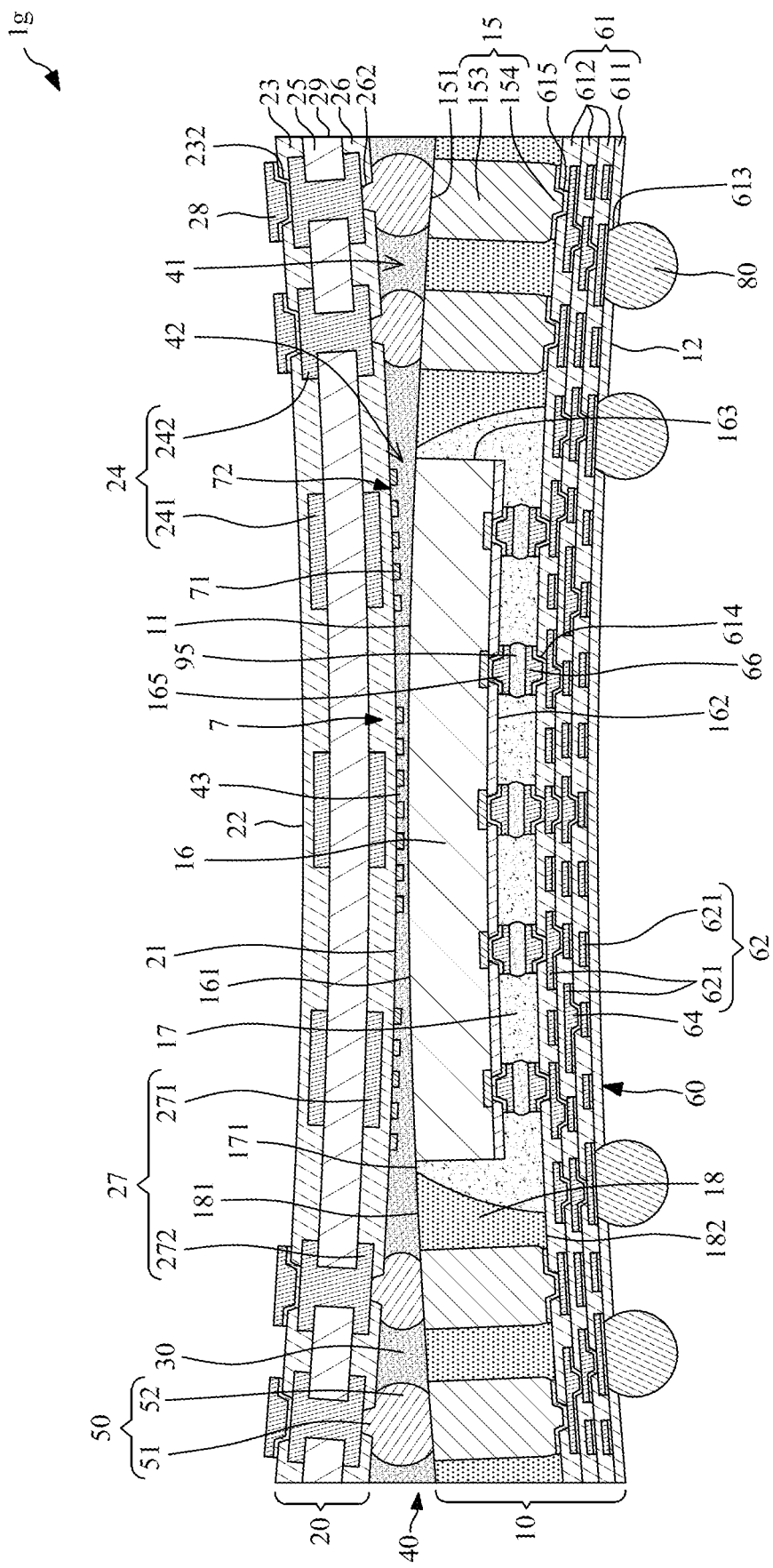
FIG. 15 illustrates a cross-sectional view of an electronic structure according to some embodiments of the present disclosure.

FIG. 15 illustrates a cross-sectional view of an electronic structure 1g according to some embodiments of the present disclosure. The electronic structure 1g of FIG. 15 is similar to the electronic structure 1e of FIG. 13, except that the circuit pattern structure 20 has a warpage. As shown in FIG. 15, the circuit pattern structure 20 is convex toward the packaging structure 10.

Figure 16:
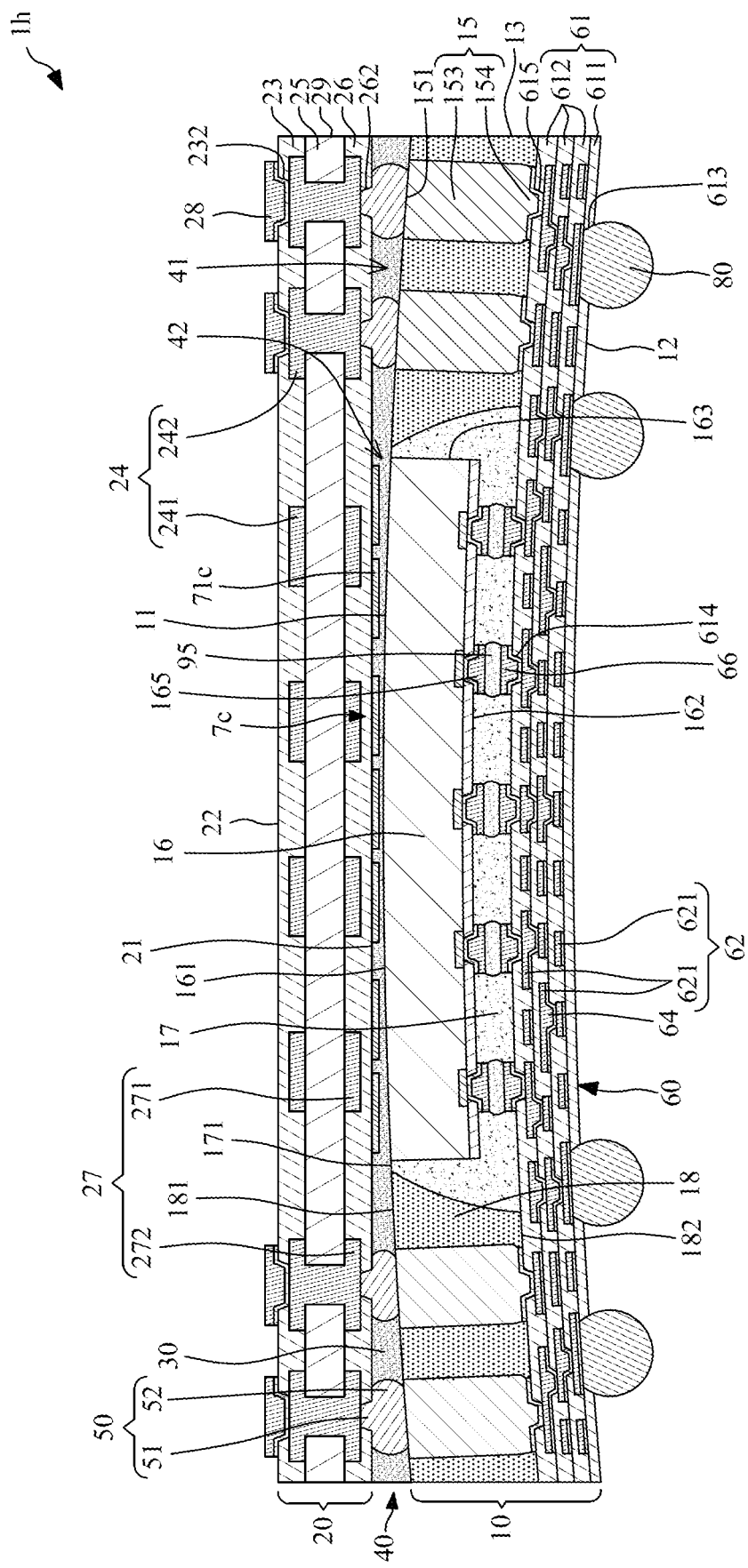
FIG. 16 illustrates a cross-sectional view of an electronic structure according to some embodiments of the present disclosure.

FIG. 16 illustrates a cross-sectional view of an electronic structure 1h according to some embodiments of the present disclosure. The electronic structure 1h of FIG. 16 is similar to the electronic structure 1c of FIG. 11, except that the packaging structure 10 has a warpage. As shown in FIG. 16, the packaging structure 10 is convex toward the circuit pattern structure 20. Thus, the height of the gap 40 gradually increases toward a lateral surface 29 of the circuit pattern structure 20, and the center portion of the gap 40 is the narrowest portion 43 of the gap 40.

Figure 17:
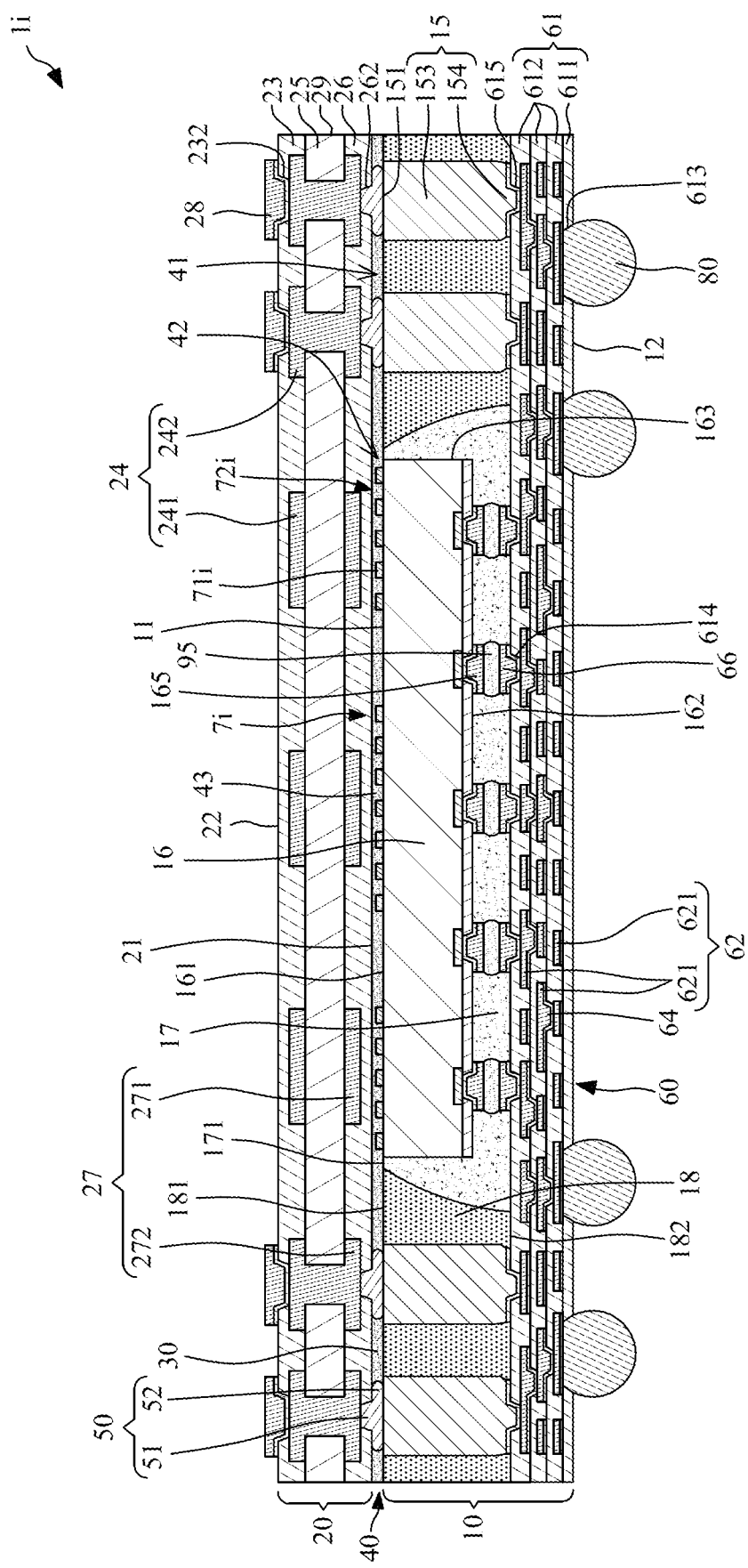
FIG. 17 illustrates a cross-sectional view of an electronic structure according to some embodiments of the present disclosure.

FIG. 17 illustrates a cross-sectional view of an electronic structure 1i according to some embodiments of the present disclosure. The electronic structure 1i of FIG. 17 is similar to the electronic structure 1 of FIG. 1, except for a structure of the protrusion structure 7i. As shown in FIG. 17, the protrusion structure 7i (including the protrusions 71i) is disposed on the top surface 11 of the packaging structure 10 (e.g., the upper surface 161 of the electronic component 16). The protrusion structure 7i (including the protrusions 71i) protrudes from the top surface 11 of the packaging structure 10. The capillary channel 72i of FIG. 17 may be similar to or same as the capillary channel 72 of FIG. 1.

Figure 18:
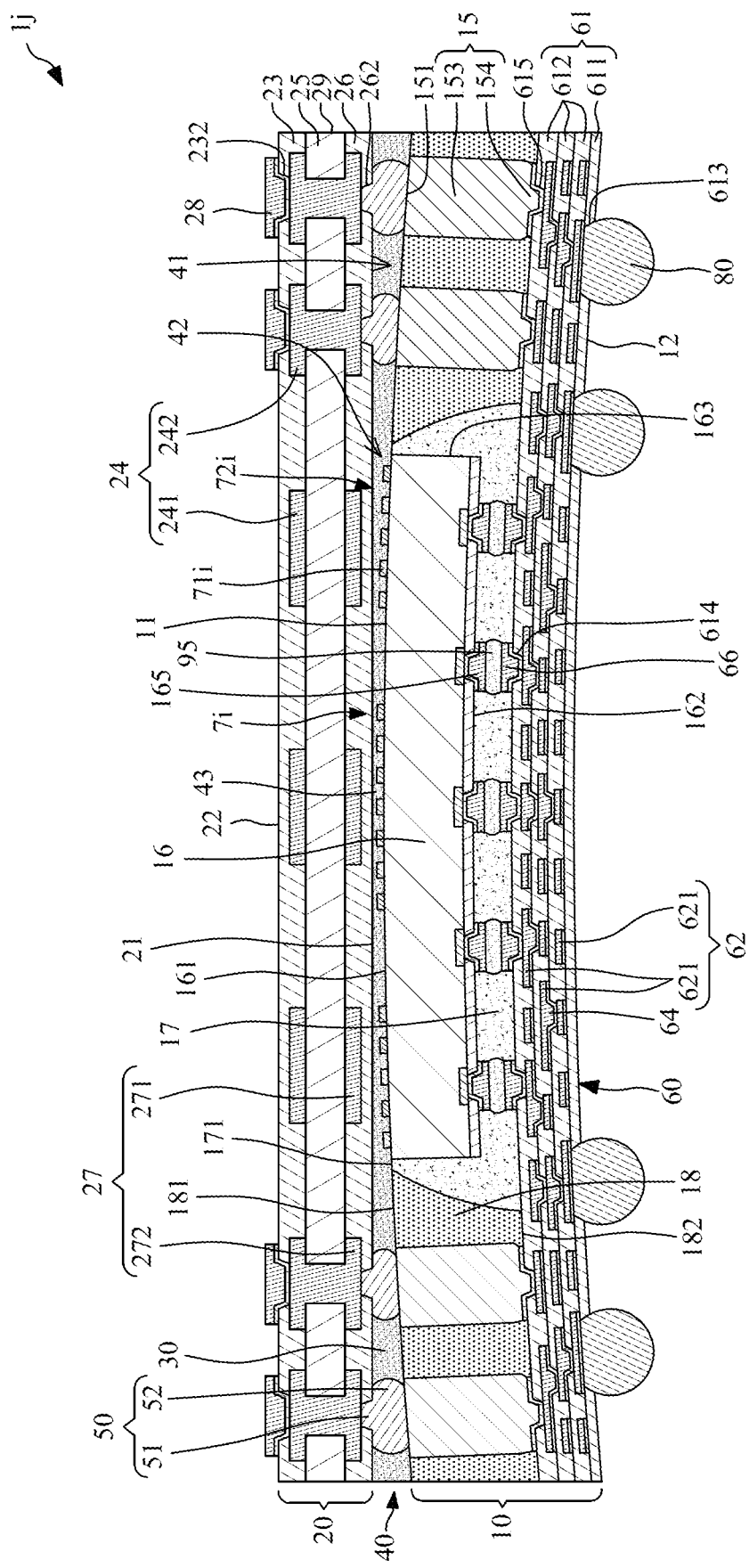
FIG. 18 illustrates a cross-sectional view of an electronic structure according to some embodiments of the present disclosure.

FIG. 18 illustrates a cross-sectional view of an electronic structure 1j according to some embodiments of the present disclosure. The electronic structure 1j of FIG. 18 is similar to the electronic structure 1i of FIG. 17, except that the packaging structure 10 has a warpage. As shown in FIG. 18, the packaging structure 10 is convex toward the circuit pattern structure 20.

Figure 19:
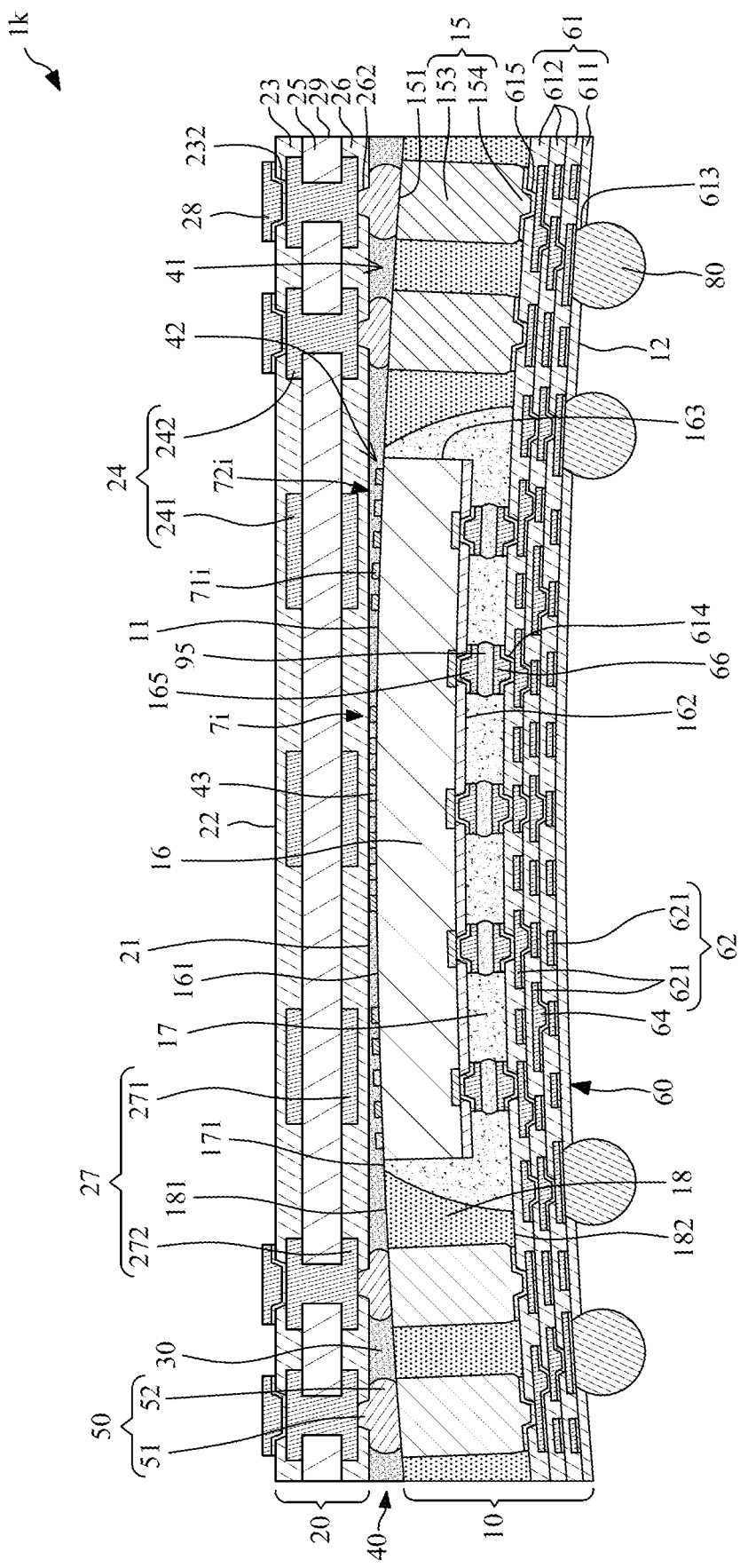
FIG. 19 illustrates a cross-sectional view of an electronic structure according to some embodiments of the present disclosure.

FIG. 19 illustrates a cross-sectional view of an electronic structure 1k according to some embodiments of the present disclosure. The electronic structure 1k of FIG. 19 is similar to the electronic structure 1j of FIG. 18, except that the protrusion structure 7i contacts the circuit pattern structure 20. For example, the protrusion 71i in the center portion of the gap 40 (or the narrowest portion 43 of the gap 40) contacts the circuit pattern structure 20.

Figure 20:
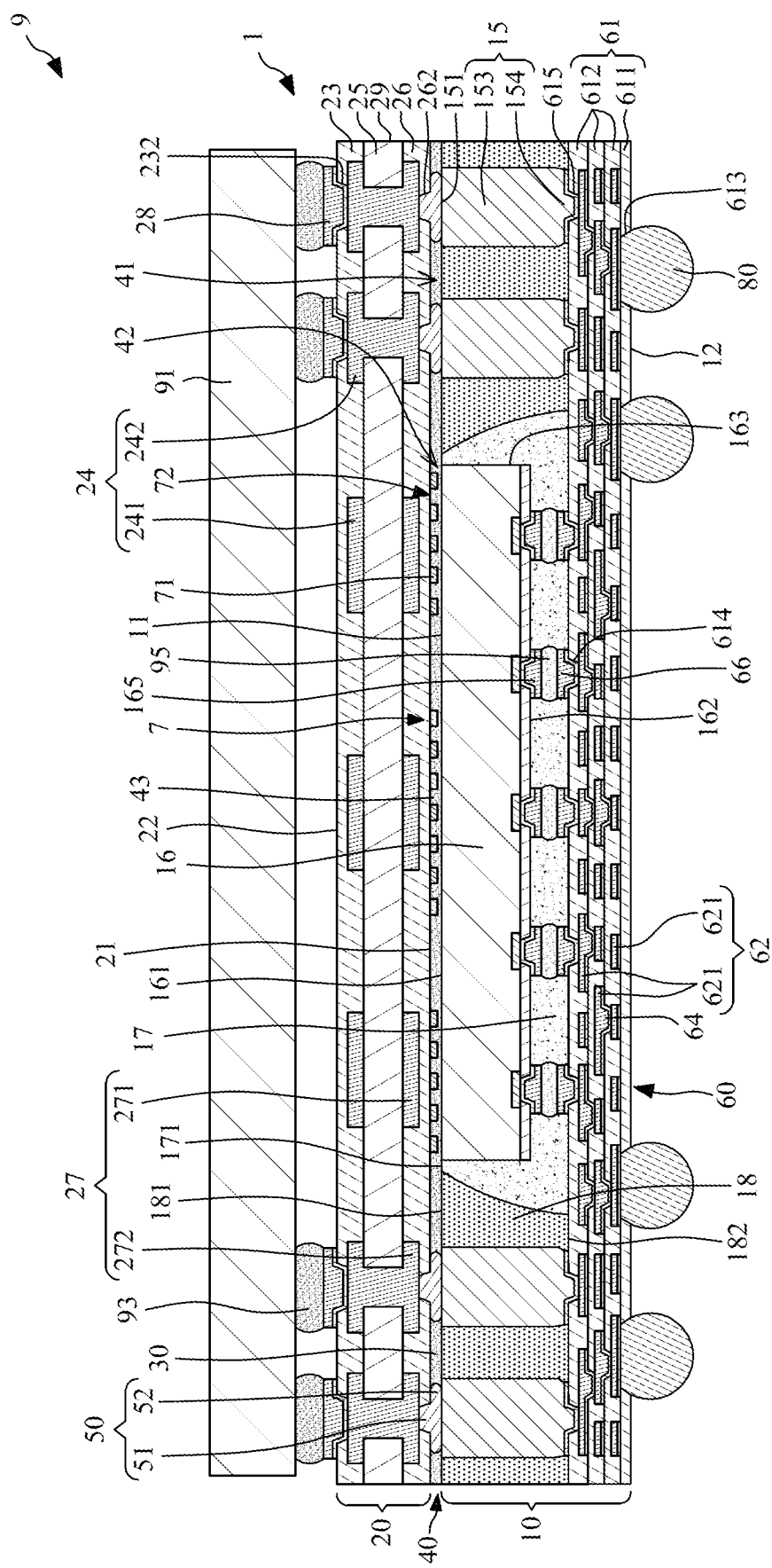
FIG. 20 illustrates a cross-sectional view of an assembly structure according to some embodiments of the present disclosure.

FIG. 20 illustrates a cross-sectional view of an assembly structure 9 according to some embodiments of the present disclosure. The assembly structure 9 may be a package structure, and may include an electronic structure 1 and an electronic device 91. The electronic structure 1 of FIG. 20 may be similar to or same as the electronic structure 1 of FIG. 1. The electronic device 91 may be a semiconductor device, and may be electrically connected to and physically connected to the bonding pads 28 of the circuit pattern structure 20 of the electronic structure 1 through a plurality of solders 93.

FIG. 21 through FIG. 30 illustrate a method for manufacturing an electronic structure according to some embodiments of the present disclosure. In some embodiments, the method is for manufacturing the electronic structure 1 shown in FIG. 1.

Figure 21:
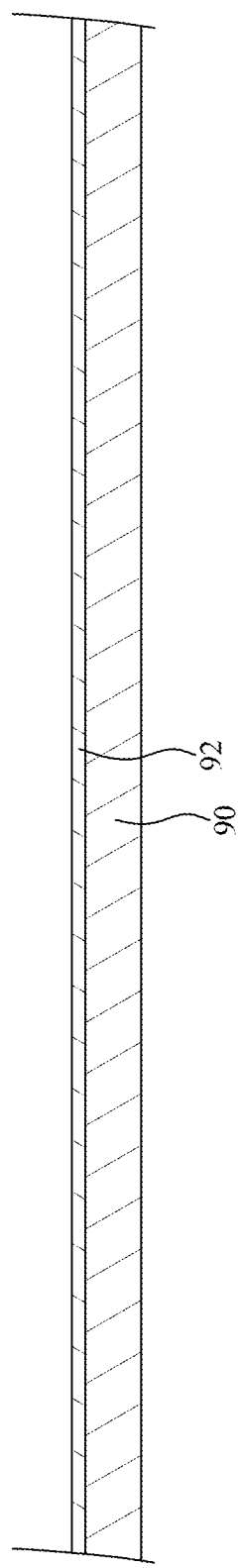
FIG. 21 illustrates one or more stages of an example of a method for manufacturing an electronic structure according to some embodiments of the present disclosure.

Referring to FIG. 21 through FIG. 26, a packaging structure 10' is provided. Referring to FIG. 21, a carrier 90 is provided. The carrier 90 may be in a wafer type or strip type. The carrier 90 may include a release layer 92 disposed thereon.

Figure 22:
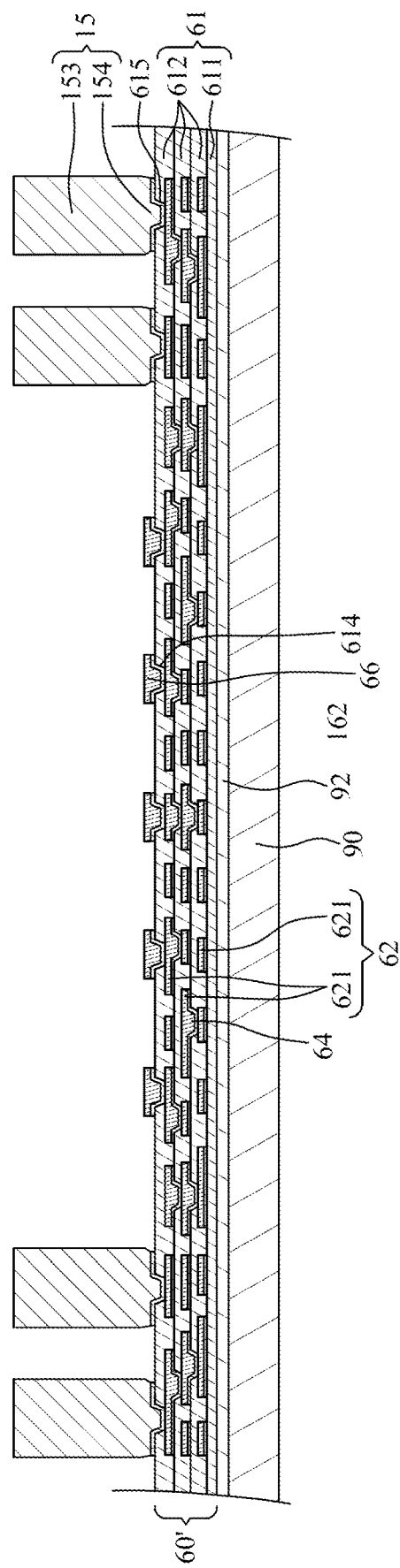
FIG. 22 illustrates one or more stages of an example of a method for manufacturing an electronic structure according to some embodiments of the present disclosure.

Referring to FIG. 22, a redistribution structure 60' is formed or disposed on the release layer 92 on the carrier 90, and then a plurality of conductive pillars 15 are formed or disposed on the redistribution structure 60'. The redistribution structure 60' of FIG. 22 may be similar to the redistribution structure 60 of FIG. 1, and may include a dielectric structure 61, a redistribution layer 62, a plurality of inner vias 64 and a plurality of bonding pads 66. The dielectric structure 61 may include a plurality of dielectric layers (including, for example, one first dielectric layer 611 and three second dielectric layers 612). The second dielectric layers 612 is formed on a top surface of the first dielectric layer 611 and stacked on one another. The redistribution layer 62 is embedded in the dielectric structure 61 and may include a plurality of circuit layers 621. The inner vias 64 electrically connect at least one circuit layer 621 or two adjacent circuit layers 621 of the redistribution layer 62. In some embodiments, the inner vias 64 may taper downward. That is, a width of each of the inner vias 64 may gradually decrease toward the first dielectric layer 611. The topmost second dielectric layer 612 may cover the topmost circuit layer 621, and may define a plurality of openings (including, for example, openings 614 and openings 615) to expose portions of the topmost circuit layer 621. The bonding pads 66 are formed in the openings 614 of the topmost second dielectric layer 612 and on the exposed portions of the topmost circuit layer 621.

The conductive pillars 15 are formed in the openings 615 of the topmost second dielectric layer 612 and on the exposed portions of the topmost circuit layer 621. The conductive pillars 15 of FIG. 22 may be similar to the conductive pillars 15 of FIG. 1, and each of the conductive pillars 15 may include an upper portion 153 and a lower portion 154 below the upper portion 153.

Figure 23:
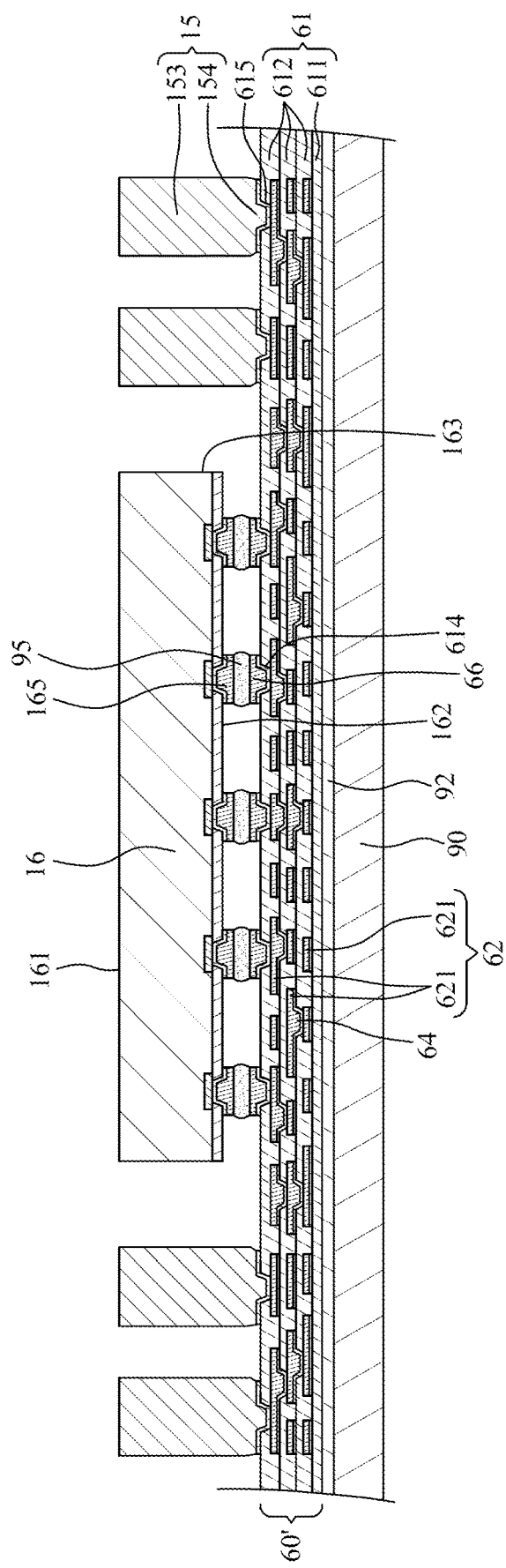
FIG. 23 illustrates one or more stages of an example of a method for manufacturing an electronic structure according to some embodiments of the present disclosure.

Referring to FIG. 23, at least one electronic component 16 is electrically connected to the redistribution structure 60'. The electronic component 16 has a lower surface 162 (e.g., active surface), and may include a plurality of conductive bumps 165 disposed adjacent to the lower surface 162. In some embodiments, the conductive bumps 165 of the electronic component 16 may be bonded to the bonding pads 66 of the redistribution structure 60' through a bonding material 95.

Figure 24:
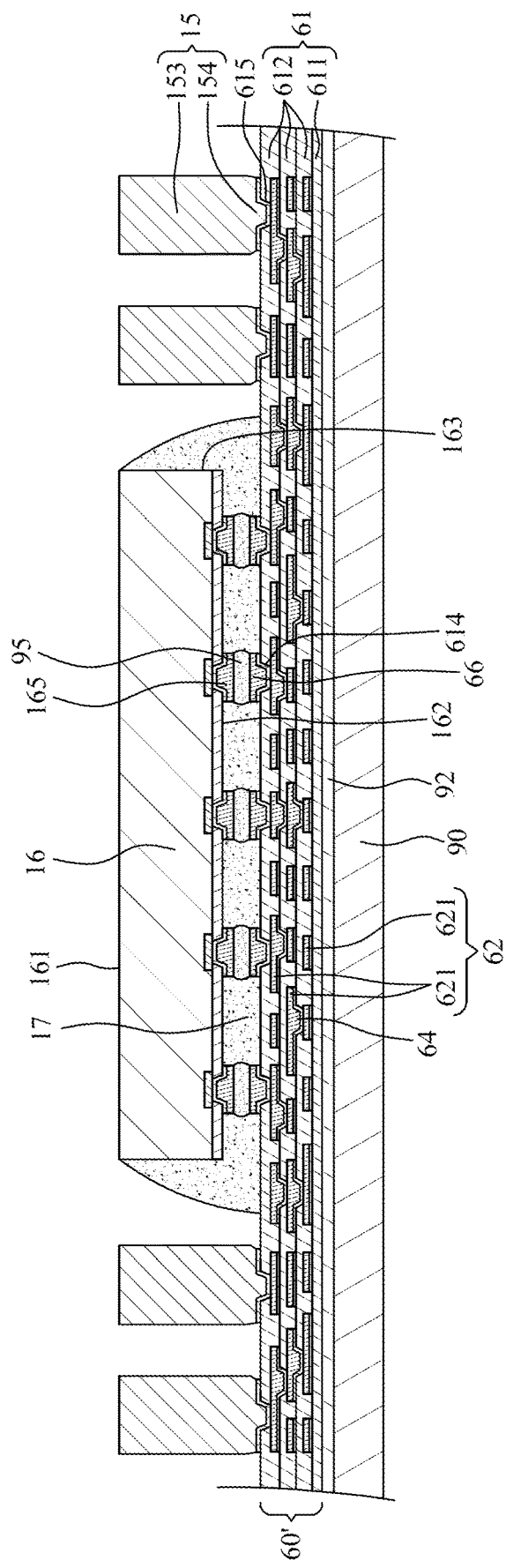
FIG. 24 illustrates one or more stages of an example of a method for manufacturing an electronic structure according to some embodiments of the present disclosure.

Referring to FIG. 24, an underfill 17 is formed on the redistribution structure 60' to cover the bonding pads 66 of the redistribution structure 60', the bonding material 95 and a portion (e.g., the conductive bumps 165, the lower surface 162 and a lateral surface 163) of the electronic component 16.

Figure 25:
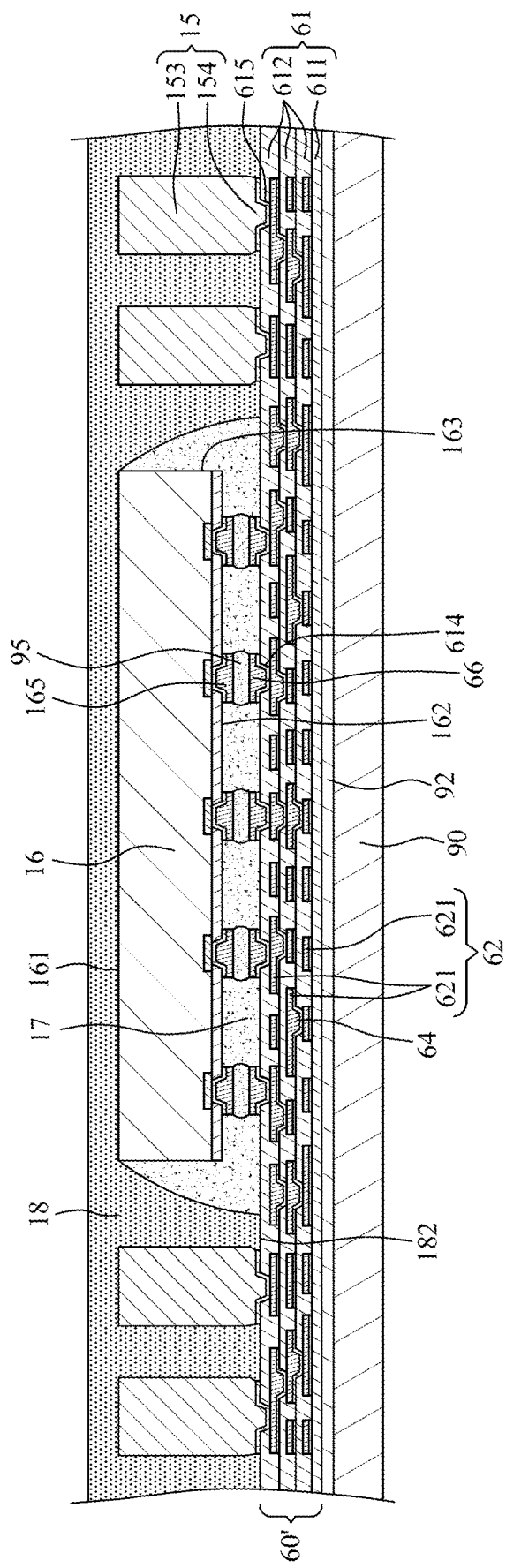
FIG. 25 illustrates one or more stages of an example of a method for manufacturing an electronic structure according to some embodiments of the present disclosure.

Referring to FIG. 25, an encapsulant 18 is formed on the redistribution structure 60' to encapsulate the electronic component 16, the conductive pillars 15 and the underfill 17. A material of the encapsulant 18 may be a molding compound with or without fillers. The encapsulant 18 has a lower surface 182.

Figure 26:
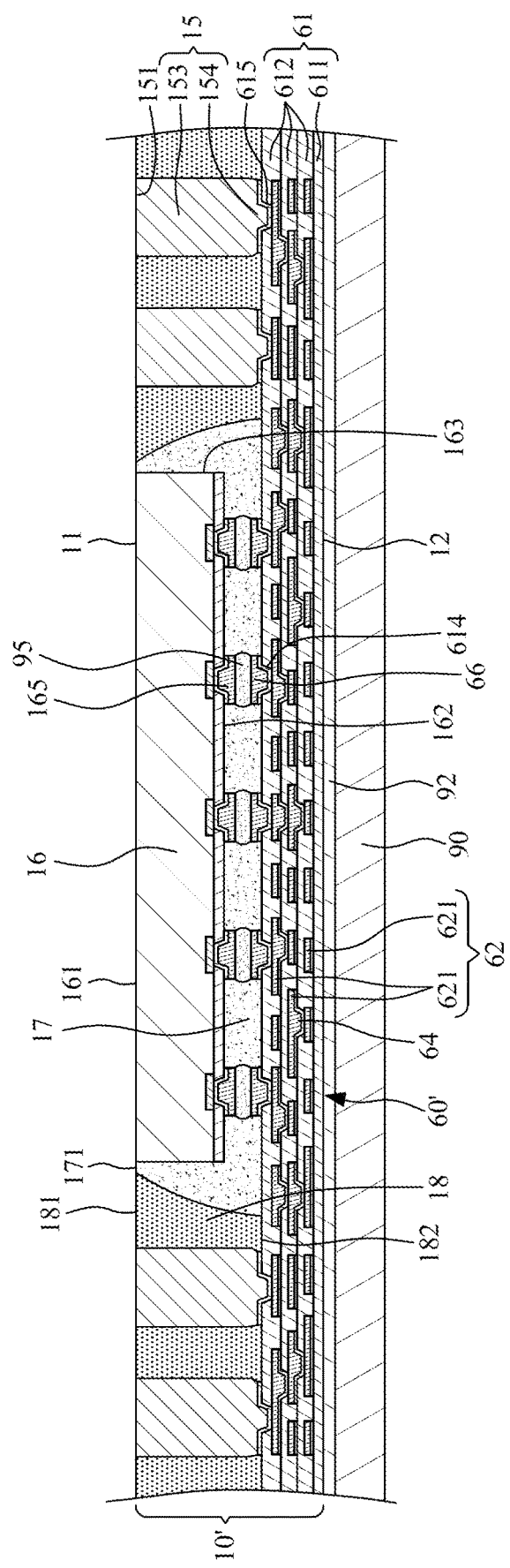
FIG. 26 illustrates one or more stages of an example of a method for manufacturing an electronic structure according to some embodiments of the present disclosure.

Referring to FIG. 26, an upper portion of the encapsulant 18 is removed through, for example, grinding. Further, a portion (e.g., the upper surface 161) of the electronic component 16, a portion (e.g., the top surface 151) of each of the conductive pillars 15 and a portion (e.g., the top surface 171) of the underfill 17 may be exposed from an upper surface 181 of the encapsulant 18. Meanwhile, the packaging structure 10' is formed. The packaging structure 10' has a top surface 11 and a bottom surface 12 opposite to the top surface 11. The top surface 11 includes the upper surface 181 of the encapsulant 18, the upper surface 161 of the electronic component 16, the top surfaces 151 of the conductive pillars 15 and the top surface 171 of the underfill 17. In some embodiments, the upper surface 181 of the encapsulant 18 may be substantially coplanar with the upper surface 161 of the electronic component 16, the top surface 151 of each of the conductive pillars 15 and the top surface 171 of the underfill 17.

Figure 27:
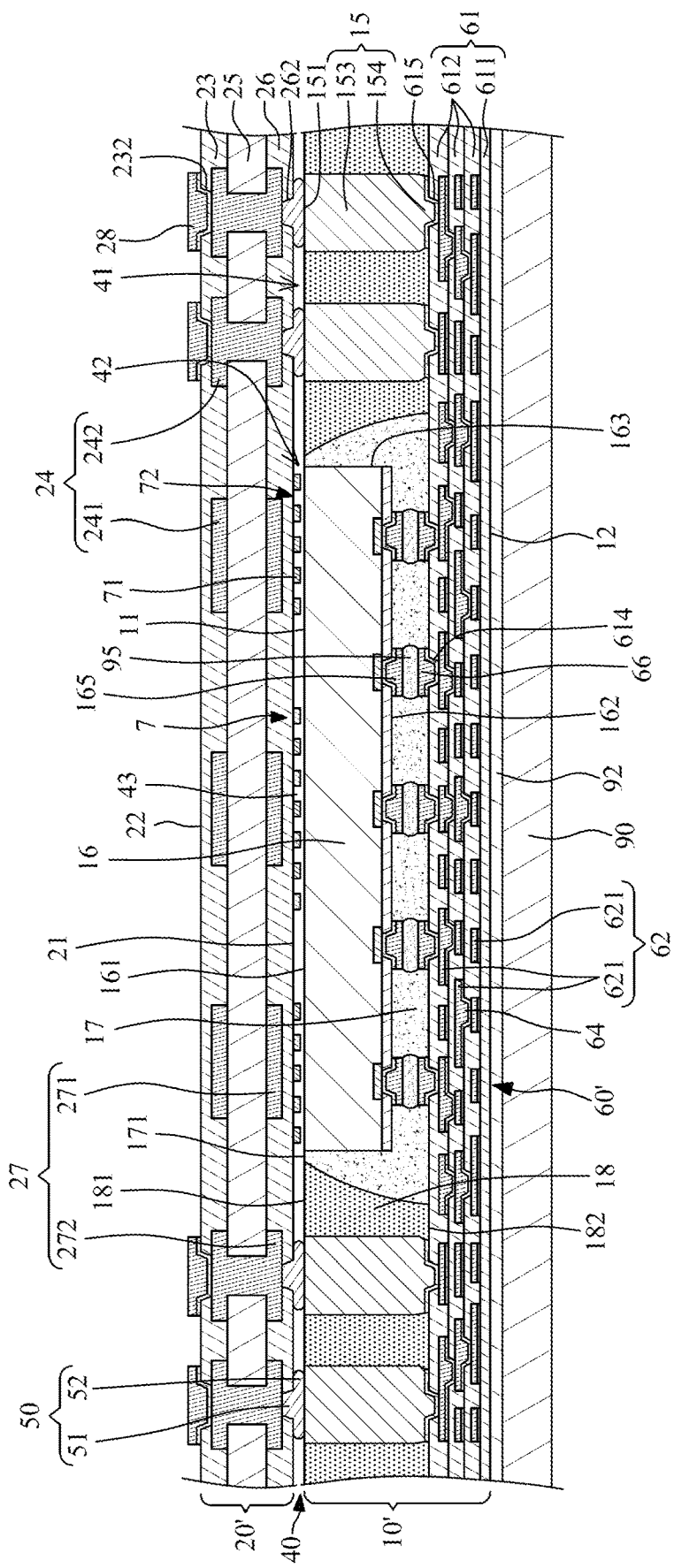
FIG. 27 illustrates one or more stages of an example of a method for manufacturing an electronic structure according to some embodiments of the present disclosure.

Referring to FIG. 27, a circuit pattern structure 20' is electrically connected and bonded to the conductive pillars 15 of the packaging structure 10' through a plurality of conductive connectors 50 after a thermocompression bonding. As shown in FIG. 27, the conductive connectors 50 are squashed on the conductive pillars 15. The conductive connectors 50 of FIG. 27 may be similar to the conductive connectors 50 of FIG. 1. Further, the circuit pattern structure 20' of FIG. 27 may be similar to the circuit pattern structure 20 of FIG. 1. As shown in FIG. 27, a gap 40 is formed between the circuit pattern structure 20' and the packaging structure 10'. The gap 40 includes a first portion 41 and a second portion 42 outside the first portion 41.

Figure 28:
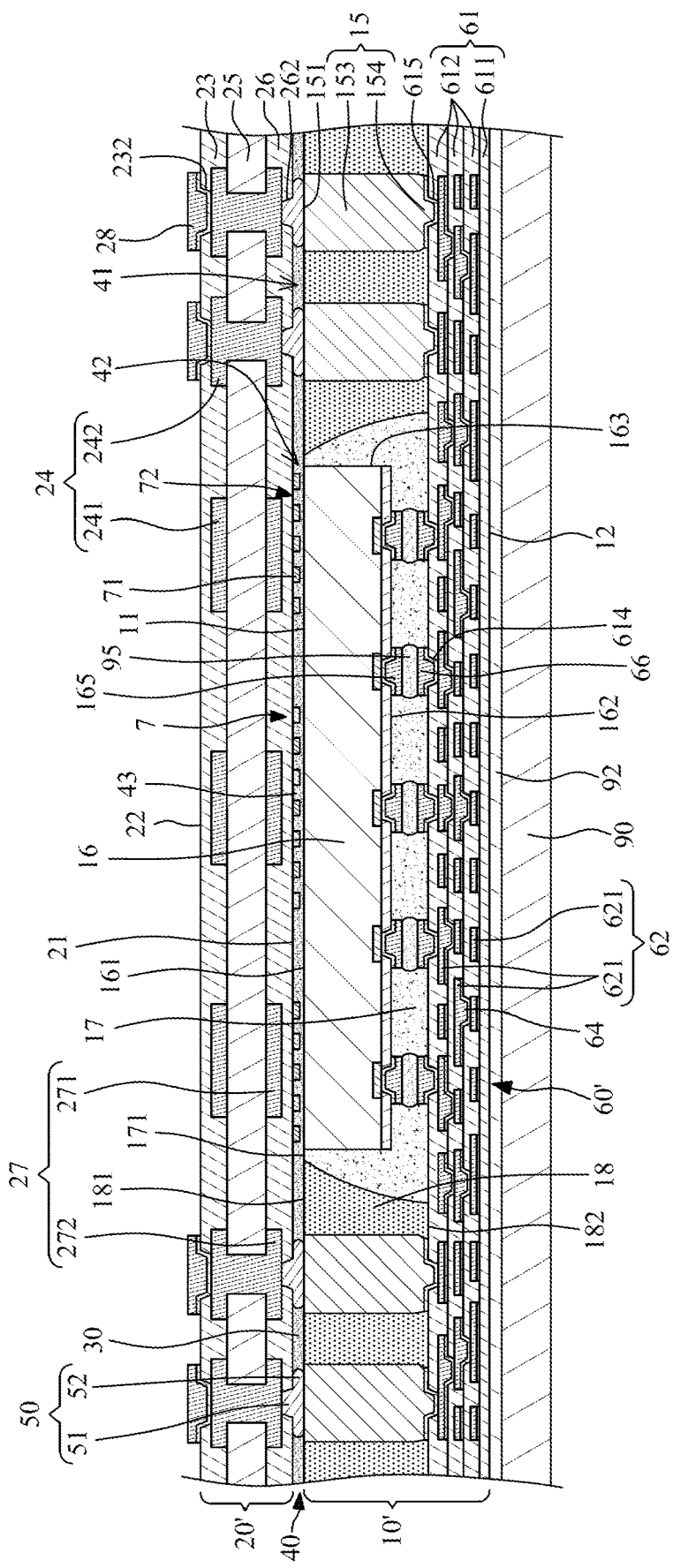
FIG. 28 illustrates one or more stages of an example of a method for manufacturing an electronic structure according to some embodiments of the present disclosure.

Referring to FIG. 28, an underfill 30 is applied to the gap 40. In the illustrated embodiment, the protrusion structure 7 is configured to facilitate the distributing of the underfill 30 in the gap 40. For example, the protrusion structure 7 is configured to facilitate the underfill 30 to flow through the second portion 42 of the gap 40.

Figure 29:
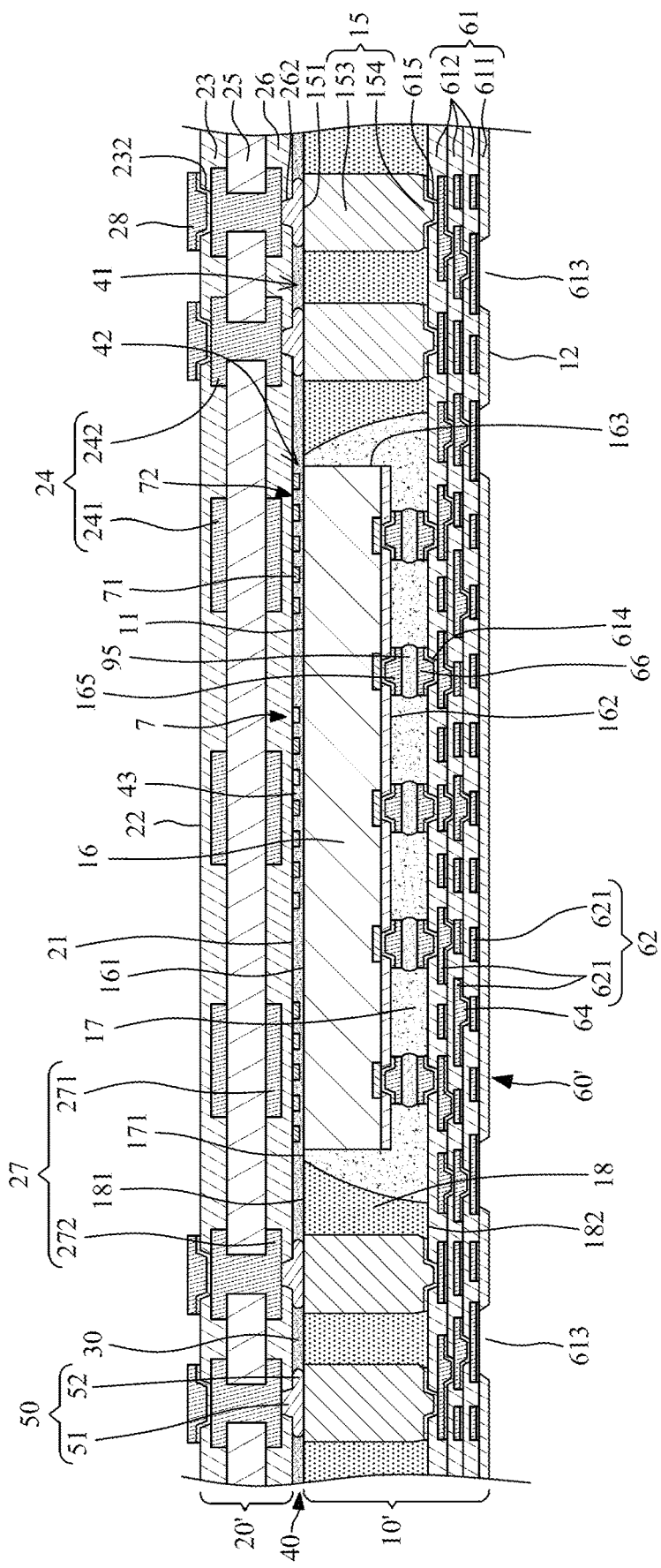
FIG. 29 illustrates one or more stages of an example of a method for manufacturing an electronic structure according to some embodiments of the present disclosure.

Referring to FIG. 29, the carrier 90 and the release layer 92 are removed, and then the first dielectric layer 611 of the dielectric structure 61 of the redistribution structure 60' is patterned to form a plurality of openings 613 extending through the first dielectric layer 611 to expose portions of the bottommost circuit layer 621 of the redistribution layer 62.

Figure 30:
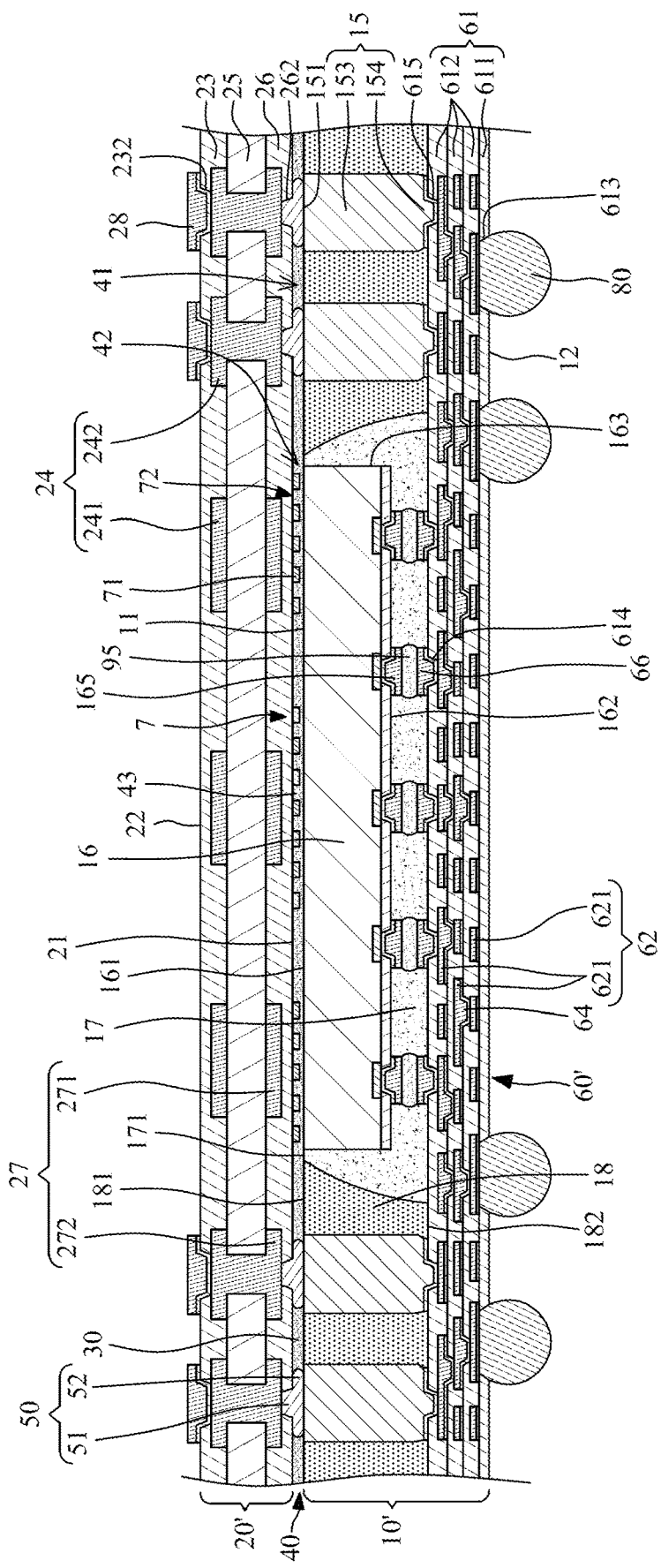
FIG. 30 illustrates one or more stages of an example of a method for manufacturing an electronic structure according to some embodiments of the present disclosure.

Referring to FIG. 30, a plurality of electrical connectors 80 are formed or disposed in the openings 613 of the first dielectric layer 611 and mounted on the exposed portions of the bottommost circuit layer 621 of the redistribution layer 62 for external connection.

Then, a singulation process is conducted to obtain a plurality of electronic structures 1 of FIG. 1.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic structure, comprising:
    a packaging structure including an electronic component and an encapsulant encapsulating the electronic component;
    a circuit pattern structure disposed over the packaging structure, wherein a gap is between the circuit pattern structure and the packaging structure;
    an underfill disposed in the gap;
    a protrusion structure disposed in the gap and over the electronic component, wherein the protrusion structure includes a plurality of protrusions protruding from the circuit pattern structure, and arranged in an array from a top view; and
    a plurality of solder materials disposed between the circuit pattern structure and the packaging structure, and spaced apart from the protrusion structure, wherein a pitch of the plurality of protrusions is less than a pitch of the plurality of solder materials.

2. The electronic structure of claim 1, wherein one of the plurality of solder materials is squashed.

3. The electronic structure of claim 2, wherein the packaging structure further includes a conductive pillar encapsulated by the encapsulant, wherein the one of the plurality of solder materials is disposed on the conductive pillar, and exposes a region of a top surface of the conductive pillar.

4. The electronic structure of claim 1, wherein a width of a space between adjacent two of the plurality of protrusions is greater than a diameter of a filler of the underfill.

5. The electronic structure of claim 1, wherein the protrusion structure protrudes from a bottom surface of the circuit pattern structure facing a top surface of the packaging structure, wherein a bottom surface of the protrusion structure is closer to the top surface of the packaging structure than to the bottom surface of the circuit pattern structure in a direction perpendicular to the top surface of the packaging structure.

6. The electronic structure of claim 5, wherein a diameter of a filler of the underfill is less than a distance between the bottom surface of the protrusion structure and the top surface of the packaging structure in the direction perpendicular to the top surface of the packaging structure.

7. An electronic structure, comprising:
    a packaging structure including an electronic component and an encapsulant encapsulating the electronic component;
    a circuit pattern structure disposed over the packaging structure, wherein a gap is between the circuit pattern structure and the packaging structure;
    an underfill disposed in the gap; and
    a protrusion structure disposed in the gap and over the electronic component, wherein the protrusion structure includes a plurality of protrusions arranged in a first array and a second array spaced apart from the first array from a top view, wherein a number of rows in the first array is different from a number of rows in the second array, and a number of columns in the first array is different from a number of columns in the second array.

8. The electronic structure of claim 7, wherein the protrusion structure is located in a region, and a width of a space between adjacent two of the plurality of protrusions in the first array increases gradually toward a periphery of the region.

* * * * *